United States Patent [19]

Lipovski

[11] Patent Number: 5,758,148
[45] Date of Patent: May 26, 1998

[54] SYSTEM AND METHOD FOR SEARCHING A DATA BASE USING A CONTENT-SEARCHABLE MEMORY

[75] Inventor: G. Jack Lipovski, Austin, Tex.

[73] Assignee: Board of Regents, the University of Texas System, Austin, Tex.

[21] Appl. No.: 987,008

[22] Filed: Dec. 7, 1992

Related U.S. Application Data

[63] Continuation-in-part of Ser. No. 577,991, Sep. 5, 1990, Pat. No. 5,184,325, which is a continuation-in-part of Ser. No. 321,847, Mar. 10, 1989, Pat. No. 4,989,180.

[51] Int. Cl.[6] .......................................... G06F 7/02
[52] U.S. Cl. .................... 395/606; 395/433; 395/435
[58] Field of Search ........................ 395/425, 600, 395/606, 433, 435; 364/900 MS, 724.19; 379/221, 284, 411; 382/10

[56] References Cited

U.S. PATENT DOCUMENTS

| | | | |
|---|---|---|---|
| 3,508,220 | 4/1970 | Stampler | 365/50 |
| 3,810,108 | 5/1974 | Krewson et al. | 365/125 |
| 3,997,882 | 12/1976 | Goyal | 365/49 |
| 4,065,756 | 12/1977 | Panigrahi | 365/49 |
| 4,172,282 | 10/1979 | Aichelmann et al. | 395/433 |
| 4,185,323 | 1/1980 | Johnson et al. | 365/222 |
| 4,232,376 | 11/1980 | Dion et al. | 365/222 |
| 4,277,833 | 7/1981 | Chambers | 365/555 |
| 4,277,838 | 7/1981 | Chambers | 365/222 |
| 4,450,520 | 5/1984 | Hollaar et al. | 395/885 |
| 4,507,748 | 3/1985 | Cotton | 364/749 |
| 4,590,465 | 5/1986 | Fuchs | 395/118 |
| 4,598,400 | 7/1986 | Hillis | 370/400 |
| 4,636,982 | 1/1987 | Takemae et al. | 365/149 |
| 4,646,306 | 2/1987 | Davis et al. | 371/49.2 |
| 4,677,592 | 6/1987 | Sakurai et al. | 365/222 |
| 4,701,879 | 10/1987 | Scarr | 365/49 |
| 4,706,221 | 11/1987 | Satoh et al. | 365/222 |
| 4,709,327 | 11/1987 | Hillis et al. | 395/384 |
| 4,710,935 | 12/1987 | Kim et al. | 371/49.2 |
| 4,716,552 | 12/1987 | Maltiel et al. | 365/222 |
| 4,718,041 | 1/1988 | Baglee et al. | 365/185.22 |
| 4,747,072 | 5/1988 | Robinson et al. | 395/428 |
| 4,748,439 | 5/1988 | Robinson et al. | 340/146.2 |
| 4,749,887 | 6/1988 | Sanwo et al. | 326/55 |
| 4,775,810 | 10/1988 | Suzuki et al. | 326/55 |
| 4,782,459 | 11/1988 | Johnston | 364/724.19 |
| 4,783,649 | 11/1988 | Fuchs et al. | 365/189 |
| 4,794,559 | 12/1988 | Greenberger | 365/49 |

(List continued on next page.)

OTHER PUBLICATIONS

Bush, "As We May Think," *Atlantic Monthly*, pp. 101–108 (Jul. 1947).

(List continued on next page.)

*Primary Examiner*—Tod R. Swann
*Assistant Examiner*—J. Peikari
*Attorney, Agent, or Firm*—Louis J. Hoffman

[57] ABSTRACT

A dynamic storage device requires periodic refresh and includes logical operation circuitry within the refresh circuitry. The individual storage positions of the storage device are periodically read by a refresh amplifier, and then a logical operation is performed on the refresh data before the data re applied to the write amplifier. That operation allows implementation of associative database searching by cyclically executing "data compare" and other logical operations within the refresh circuitry. A system of content searching may be implemented in any storage device, dynamic or not, in which a comparand may be matched with any of a plurality of subunits of a word, and a storage bit is used to identify any words in which a mismatch occurs. Upon recognizing a match, the device can be commanded (a) to output the word or a selected portion (which may be different than the matched portion), (b) to move a selected portion of the word to a different location in the word, or (c) to alter the bits of the word or a selected portion. Arithmetical operations may be implemented through such alterations after matching. Off-chip storage systems of use with such devices are also disclosed.

68 Claims, 15 Drawing Sheets

U.S. PATENT DOCUMENTS

| | | | |
|---|---|---|---|
| 4,799,192 | 1/1989 | Wade et al. | 365/49 |
| 4,831,585 | 5/1989 | Wade et al. | 365/49 |
| 4,833,642 | 5/1989 | Ooi | 365/49 |
| 4,835,733 | 5/1989 | Powell | 395/421.08 |
| 4,882,699 | 11/1989 | Evensen | 379/284 |
| 4,931,994 | 6/1990 | Matsui et al. | 365/189.01 |
| 4,989,180 | 1/1991 | Lipovski | 365/189.07 |
| 4,991,136 | 2/1991 | Mihara | 365/49 |
| 5,073,864 | 12/1991 | Methvin et al. | 364/715.11 |
| 5,214,715 | 5/1993 | Carpenter et al. | 382/15 |
| 5,285,411 | 2/1994 | McAulay | 365/49 |

OTHER PUBLICATIONS

Lee, "Intercommunicating Cells, Basis for a Distributed Logic Computer," *Proc. FJCC*, pp. 130–136 (1962).

Lee et al., "A Content Addressable Distributed Logic Memory with Applications to Information Retrieval," *Proceedings of the IEEE*, vol. 51, pp. 924–932 (Jun. 1963).

Crane et al., "Bulk Processing in Distributed Logic Memory," *IEEETC*, vol. EC–14, pp. 186–196 (Apr. 1965).

Slotnick, "Logic Per Track Devices," *Advances in Computers*, pp. 291–296 (1971).

Batcher, "The Flip Network in Staran," *Proc 1976 Int. Conf. on Parallel Processing*, pp. 65–71 (Aug. 1976).

Lipovski, "Architectural Features of CASSM: A Context Addressed Segment Sequential Memory," *Proceedings of the 5th ISCA*, pp. 31–38 (Apr. 3–5, 1978).

Bray et al., "Data Base Computers," pp. 106–120 (D.C. Heath & Co. 1979).

Hollaar, "Text Retrieval Computers," *Computer*, vol. 12, No. 3, pp. 40–52 (1979).

Fuchs et al., "Developing Pixel–Planes, A Smart Memory–Based Raster Graphics System," 1982 Conference on Advanced Research in VLSI, pp. 371–380 (MIT Jan. 27, 1982).

*IC Memories Data Book*, pp. 356–363 (Hitachi Mar. 1987).

Hodges et al., "Dynamic Read–Write Memories," *Analysis and Design of Digital Integrated Circuits*, Sec. 9.3, pp. 372–380 (McGraw–Hill, 2nd ed. 1988).

Lineback, "SEEQ's 512–KBIT Flash EEPROMS Support In–System Programming on 12–v Supply" (1988).

Johnson, "Design and Analysis of Fault–Tolerant Digital Systems," pp. 63–65 (Addison–Wesley 1989).

Robinson, "Chameleon: A Pattern Matching Memory System," Technical Report HPL–SAL–89–24 (Hewlett Packard Co. Apr. 19, 1989).

Lipovski, G.J., "A Four Megabit Dynamic Systolic Associative Memory Chip," Dept. of Elec. and Computer Engr., Univ. of Texas, Austin, Texas (Sep. 4, 1990).

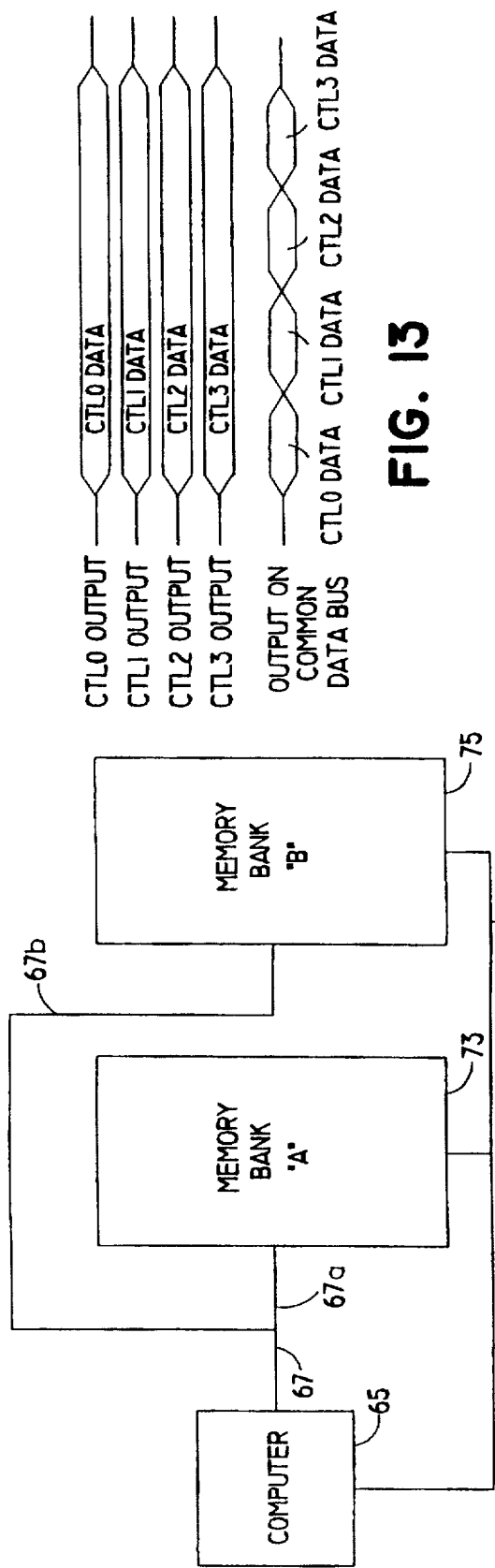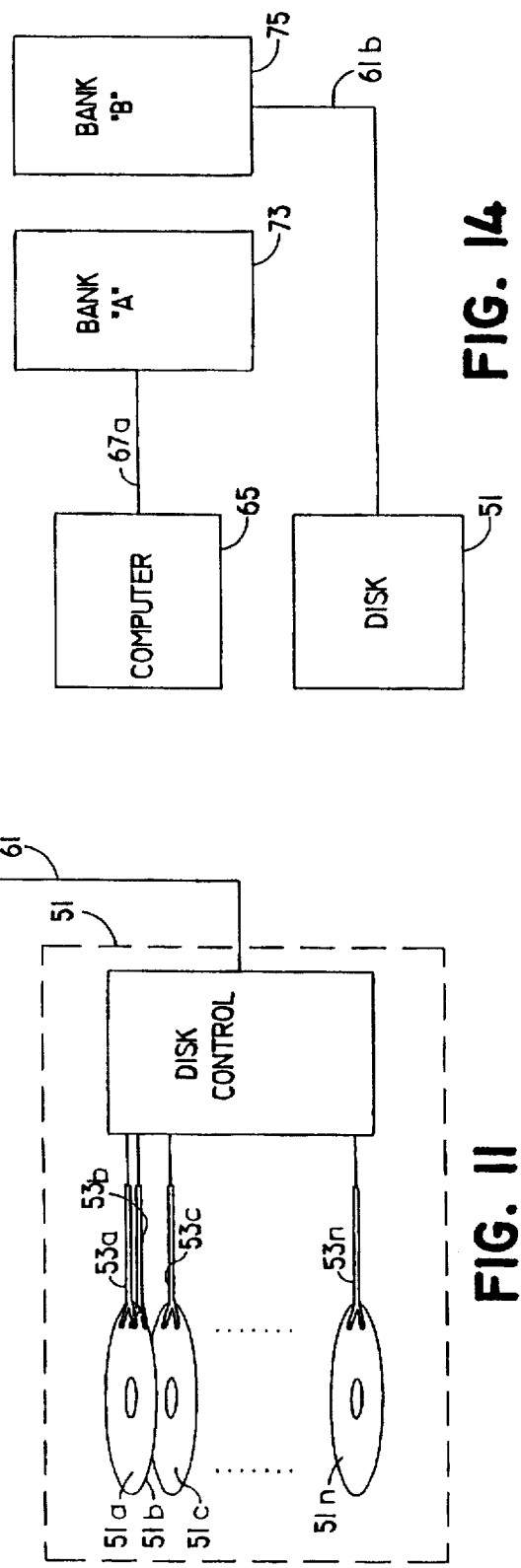

```
C     %1xxxxxxx   if carry set
MW    %0xxxxxxx   clear the carry
C     %xxxx1xx0   if a0 is 1 and b0 is 0
MW    %0xxxxxx1   make the carry 0 and make b0 1
CNA   %xxxx1xx1   if a0 is 1 and b0 is 1 (but not if the byte
                    was changed in the previous instruction)
MW    %1xxxxxx0   make carry 1 and b0 0
C     %1xx0xx0x   if carry is 1 and a1 is 0 and b1 is 0
CO    %0xx1xx0x   or if carry is 0 and a1 is 1 and b1 is 0
MW    %0xxxxx1x   make carry 1 and b1 1
CNA   %0xx1xx1x   if a1 is 1 and b1 is 1 (but not if the byte
                    was changed in the previous instruction)
CO    %1xx0xx1x   or carry is 1, a1 is 0, and b1 is 1
MW    %11xxxx0x   make carry 1, mid carry 1, and b1 0
C     %1x0xx0xx   if carry is 1, a2 is 0, and b2 is 0
CO    %0x1xx0xx   or carry is 0, a2 is 1, and b2 is 0
MW    %0xxxx1xx   make carry 0 and b2 1
CNA   %0x1xx1xx   if carry is 0, a2 is 1, and b2 is 1 (but not if
                    the byte was changed in the previous instruction)
CO    %1x0xx1xx   or carry is 1, a2 is 0, and b2 is 1
MW    %1xxxx0xx   make carry 1 and b2 0
C     %1xxxxxxx   if carry is 1 (after the compare), read the byte
                    having b5,b4,b3,a5,a4,a3 into sense amps
MW    %1xxxxxxx   write 1 in carry of the newly read byte (this
                    transfers the previously computed carry to this byte)
*****This begins similar operations on bits 3,4 and 5.
C     %1xxx0xx0   if carry is 1, a3 is 0, and b3 is 0
CO    %0xxx1xx0   or carry is 0, a3 is 1, and b3 is 1
MW    %0xxxxxx1   make carry 0 and b3 1
CNA   %0xxx1xx1   if carry is 0, a3 is 1, and b3 is 1 (but not if the
                    byte was changed in the previous instruction)
CO    %1xxx0xx1   or if carry is 1, a3 is 0, and b3 is 1
MW    %1xxxxxx0   make carry 1 and b3 0
C     %1xx0xx0x   if carry is 1, a4 is 0, and b4 is 0
CO    %0xx1xx0x   or carry is 0, b4 is 1, and a4 is 0
MW    %0xxxxx1x   make carry 0 and b4 1
CNA   %0xx1xx1x   if carry is 0, a4 is 1, and b4 is 1 (but not if the
                    byte was changed in the previous instruction)
```

FIG. 21a

```
CO   %1xx0xx1x   or carry is 1, a4 is 0, and b4 is 1
MW   %11xxxx0x   make carry 1, mid carry 1, and b4 0
C    %1x0xx0xx   if carry is 1, a5 is 0, and b5 is 0
CO   %0x1xx0xx   or carry is 0, a5 is 1, and b5 is 0
MW   %0xxxx1xx   make carry 0 and b4 1
CNA  %0x1xx1xx   if carry is 0, a5 is 1, and b5 is 1 (but not if the
                  byte was changed in the previous instruction)
CO   %1x0xx1xx   or carry is 1, a5 is 0, and b5 is 1
MW   %1xxxx0xx   make carry 1 and b5 0
C    %1xxxxxxx   if carry is 1 (after the compare), read the byte
                  having b8, b7, b6, a5, a7, a6 into sense amps
MW   %1xxxxxxx   write 1 in carry of the newly read byte (this transfers
                  the previously computed carry to this byte)
****** This begins similar operations on bits 6, 7 and 8.
C    %1xxx0xx0   if carry is 1, a6 is 0, and b6 is 0
CO   %0xxx1xx0   or carry is 0, a6 is 1, and b6 is 1
MW   %0xxxxxx1   make carry 0 and b6 1
CNA  %0xxx1xx1   if carry is 0, a6 is 1, and b6 is 1 (but not if the
                  byte was changed in the previous instruction)
CO   %1xxx0xx1   or if carry is 1, a6 is 0, and b6 is 1
MW   %1xxxxxx0   make carry 1 and b6 0
C    %1xx0xx0x   if carry is 1, a7 is 0, and b7 is 0
CO   %0xx1xx0x   or carry is 0, b7 is 1, and a7 is 0
MW   %0xxxxx1x   make carry 0 and b7 1
CNA  %0xx1xx1x   if carry is 0, a7 is 1, and b7 is 1 (but not if the byte
                  was changed in the previous instruction)
CO   %1xx0xx1x   or carry is 1, a7 is 0, and b7 is 1
MW   %11xxxx0x   make carry 1, mid carry 1, and b7 0
C    %1x0xx0xx   if carry is 1, a8 is 0, and b8 is 0
CO   %0x1xx0xx   or carry is 0, a8 is 1, and b8 is 0
MW   %0xxxx1xx   make carry 0 and b8 1
CNA  %0x1xx1xx   if carry is 0, a8 is 1, and b8 is 1 (but not if the
                  byte was changed in the previous instruction)
CO   %1x0xx1xx   or carry is 1, a8 is 0, and b8 is 1
MW   %1xxxx0xx   make carry 1 and b8 0
```

FIG. 21b

SYSTEM AND METHOD FOR SEARCHING A DATA BASE USING A CONTENT-SEARCHABLE MEMORY

This is a continuation-in-part of application Ser. No. 577,991, filed Sep. 5, 1990, now U.S. Pat. No. 5,184,325, which is a continuation-in-part of application Ser. No. 321,847, filed Mar. 10, 1989, now U.S. Pat. No. 4,989,180. This application is related to PCT/US93/11820.

FIELD OF INVENTION

The invention relates to refreshable dynamic associative memory storage devices and systems incorporating such devices.

BACKGROUND OF THE INVENTION

Referring to FIG. 1, a schematic of a typical construction of a dynamic random access memory (DRAM) is shown. During the write mode, data to be written into the DRAM is applied to the input and amplified by write amplifier WR. Switches S2 and S3 are open, switches S1 and S4 are closed, and capacitor C is either charged or discharged according to the status of the input data, and amplified by write amplifier WR. During the read mode, switches S1, S3 and S4 are open, and switch S2 is closed so that the voltage on capacitor C is compared to a reference voltage Vref by read amplifier RE. According to the difference determined by read amplifier RE, either a binary "one" or "zero" is transmitted to the output of the DRAM. When in the data-hold mode, all the switches S1, S2, S3 and S4 remain open so that the stored charged remains in capacitor C. However, due to the unavoidable presence of leakage resistance R, the capacitor charge will gradually dissipate. To compensate for this, a process called refreshing must be periodically used in the DRAM. To achieve refreshing, all three switches S1, S2 and S3 are closed, switch S4 is open, and the binary state detected by read amplifier RE is amplified by write amplifier WR and reapplied to storage capacitor C. Switches S3 and S4 thus form a multiplexer which selects either input data or refresh data for application to write amplifier WR. The dashed line in FIG. 1 represents the boundary of an integrated circuit chip. Elements within the dashed line are typically integrated on a single chip.

In practice, a DRAM includes a great number of storage capacitors C arranged in matrix of array form along with row decoder and column decoder circuitry. The storage elements of the array must be periodically refreshed, and are typically refreshed on a row-by-row basis. The row decoder and column decoder circuitry, as well as the read amplifiers and write amplifiers, are typically integrated within the same semiconductor chip with the individual storage elements of the array. FIG. 2 is a block diagram of a type HM 511000 dynamic RAM available from Hitachi America, Ltd., which includes eight 128k memory cell arrays 10 connected through read/write amplifiers 11 to I/O bus 12. Individual rows and columns of the cell arrays 10 are selected by row decoder 13 and column decoder 14, under control of address data contained on address bus 15 via row address buffer 16 and column address buffer 17, and under control of row access strobe signal RAS, and column access strobe signal, CAS. Reading and writing is controlled by read/write input, WE, and serial input and output data is buffered in I/O buffer 18. Once again, elements within the dashed line in FIG. 2 are integrated together on a single chip.

When logical operations are required to be performed on data stored in a DRAM, data must be read from the desired storage elements of the array and applied to the single-bit serial output of the DRAM for application to logic circuitry external to the integrated circuit chip. After the logic function is performed, the result is applied to the single-bit input of the DRAM for buffering and storage in desired storage elements of the array. Such operation of a dynamic RAM is found, for example, in single-instruction-multiple-datastream (SIMD) computers wherein a single logical operation is performed on a plurality of data elements. Such SIMD operations may be performed cyclically in order to trade off cost for speed. During cyclic operation, the same operation is performed in one or more data cells, and within each data cell, the operation is performed identically on one or more data words which are processed sequentially. However, as mentioned above, periodic refreshing of the dynamic RAM is necessary in order to avoid dissipation of the data indicating charge on the storage capacitor. This refreshing is generally interleaved with any logical operations performed on the data, which necessarily limits the speed at which cyclic logical operations can be performed on data stored in a dynamic RAM.

SUMMARY OF THE INVENTION

The present invention avoids the drawbacks of the prior art by incorporating logic circuitry within the refresh circuitry of a dynamic RAM which allows performance of cyclic logical operations on stored volatile data, concurrent with the periodic refresh of the volatile data. Thus, all data being refreshed is processed by a simple logical unit in the refresh circuit. This combination of refresh with logical operation eliminates the need for a separate refresh cycle by performing the logical operation during the refresh cycle, and greatly improves the cyclic processing speed of logical operations performed on stored data.

The present invention has particular application in data base or associative systems wherein all stored data is accessed and tested, for example, when conducting data string searches. In such a data base searching system, a data comparator is inserted into the refreshing loop, and is used to compare target data with data being cyclically refreshed in order to simultaneously perform data refresh and target data searching.

The inventive memory circuit can be used as a buffer for other, non-volatile storage devices, such as hard disks, thereby allowing parallel searching of the stored data.

BRIEF DESCRIPTION OF THE DRAWINGS

FIG. 11 is a block diagram of a module of a system according to the present invention that uses several dynamic associative addressable memories as disk buffer.

FIG. 13 is an example timing diagram for the transfer of data from disk to memory in the embodiment shown in FIG. 12.

FIG. 14 is an example block diagram showing the bus contacts of the system in a particular state.

FIG. 21 is a sample program illustrating an efficient way of performing Boolean arithmetic in the memory of the invention.

DETAILED DESCRIPTION OF THE PREFERRED EMBODIMENT

Figure 3:
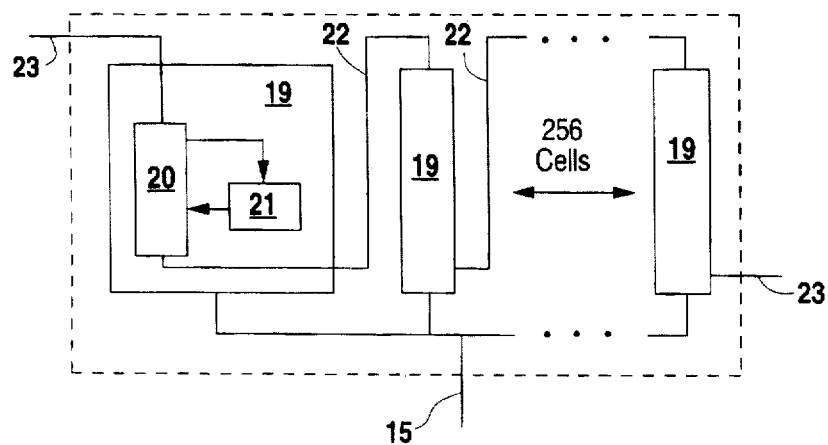
FIG. 3 is a dynamic random access memory employing logic in refresh circuitry, according to the present invention.

Referring to FIG. 3, a one megabit volatile memory employing logic-in-refresh according to the present invention is disclosed. The memory is organized within the chip as a 512-row, 2048 bit-per-row memory in which an entire 2048-bit row is read, one after another, in each refresh cycle. The refresh row unit length might be different from the length of the associative memory word unit that can be searched or output as a unit. Either the entire 2048-bit row, or a fraction of the 2048-bit row, can be considered a single word in an associative memory. For example, referring to FIG. 3, if an 8-bit byte is chosen as the length of the associative memory word in a one-megabit memory, 256 cells 19 result, each having a 512-word memory array 20, 8-bits-per-word. Herein, a "word" is a unit of data that is considered by the user as a whole, a "row" refers to a unit of data read or written as a whole, and a "byte" is that portion of a row contained in a word.

According to the present invention, each cell 19 includes logic circuitry, such as comparator 21, to operate on the data as it is sequentially and cyclically read out, refreshed and written back into memory. During a refresh operation, a 9-bit counter, either external or internal to the chip, provides 512 consecutive row addresses, one address per memory refresh cycle. Thus, all words of each cell 19 of the memory are read in 512 memory refresh cycles and are searched during that time. For one mode of operation, the bottom byte of each cell 19 is logically linked to the top byte of the next cell 19 within a single chip by bus 22. In another mode of operation, each word, as a sequence of 512 bytes, is considered separately. Elements within the dashed line are integrated together in a single semiconductor material integrated circuit chip. A plurality of chips can be cascaded by logically linking the bottom word of the last cell in one chip to the top of the next cell in the neighboring chip by bus 23.

Figure 4:
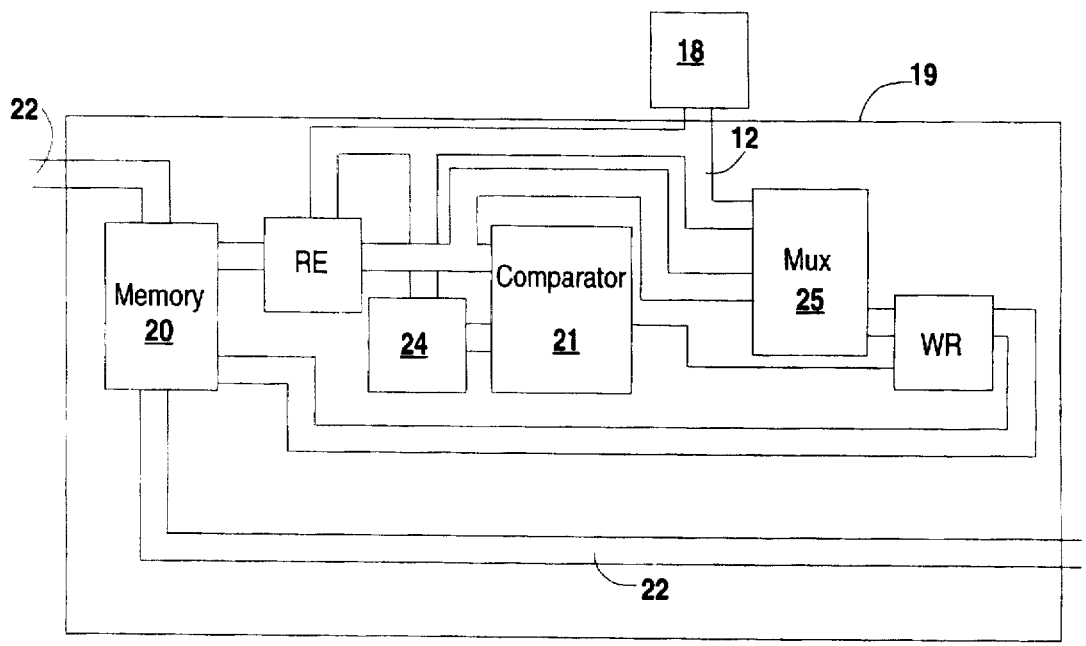
FIG. 4 is a dynamic random access memory employing search logic in the refresh circuitry, according to the present invention.

The configuration of each cell 19 is shown in more detail in FIG. 4. Referring to FIG. 4, data stored in each byte can be, for example, ASCII characters in text streams, which are each 7 bits wide together with a mark bit, which is the 8th bit. Initially, all mark bits are cleared, and are subsequently set and cleared to mark the results of a search. Each byte is sequentially read by the 8-bit wide read amplifier, RE, and the 7 data bits are applied to comparator 21 where the read 7-bit byte is compared with the 7-bit comparand stored in comparand register 24. A comparand is loaded into comparand register 24 through I/O bus 12.

Figure 1:
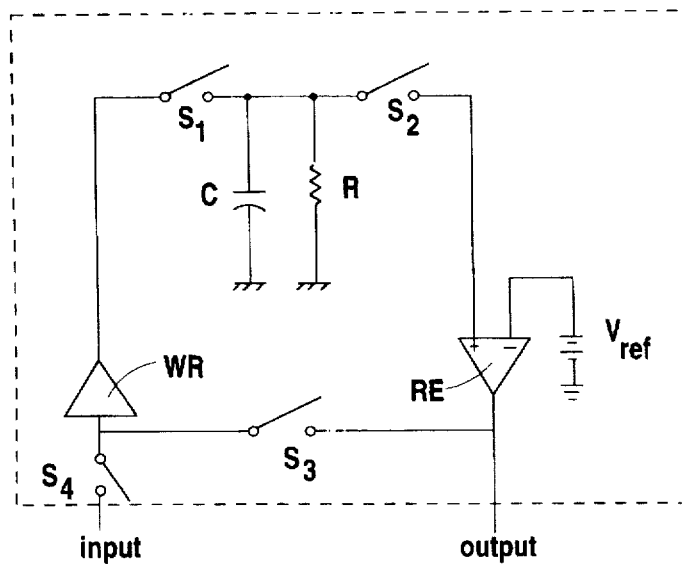
FIGS. 1 and 2 are schematic representations of prior art dynamic random access memories.

The output of read amplifier, RE, is also applied to multiplexer 25 along with data from I/O buffer 18 through I/O bus 12. The output of multiplexer 25 is applied to 8-bit write amplifier, WR, along with the single-bit (mark bit) output of comparator 21. Read amplifier, RE, is also connected to I/O bus 12 in a known manner through tri-state buffers, or the like, to enable outputting of data. Thus, according to the present invention, comparator 21 and comparand register 24 are added to the preexisting refresh circuitry of a DRAM illustrated schematically in FIG. 1 (note that switches S3 and S4 illustrate the function of multiplexer 25). All components are integrated on the same semiconductor material integrated circuit chip.

In operation, to search-and-mark byte, a byte-wide comparand is simultaneously broadcast to all cells 19, and stored in respective comparand registers 24. Then, the 512 bytes in memory array 20 of each cell 19 are each cyclically read, refreshed and rewritten. The 8th bit of each byte stores the result of any match with the comparand in comparand register 24. The results of the match are stored in 8th bit of the next byte in memory array 20 adjacent and below the one that the comparand matches. This is repeated for all 512 bytes in each cell 19. The result of a search on the last byte of a cell is effectively stored in the first byte of the adjacent cell through bus 22.

If all mark bits are cleared, and the comparand searches for a 7-bit character and a zero as the 8th bit, an unconstrained search for a character is done. If the comparand searches for a character and a "1" in the 8th bit, a search for the character will then match the comparand only if the previous byte stored in memory array 20 matched the previous comparand searched. Thus, a string of characters can be searched for, one character in each successive refresh operation.

A variation of this operation is to continue to mark bytes in memory until a match is found. In this variation, once the 8th bit (mark bit) of a byte has been set, as bytes continue to rotate through the refresh circuitry, the 8th bit of all subsequent bytes are set until a match for the next comparand (for example, an end-of-text character) is found. This variation is used to mark the remainder of a target string of characters, once a character within the target string is found, and facilitates output of or rewriting the target string.

The output of the result of a search from a single cell can simply be read out as the character into I/O buffer 18 if the 8th bit is set. As a byte passes the refresh logic, if the 8th bit is set, the byte is presented by read amplifier, RE, to I/O buffer 18, and the 8th bit will then be cleared. In a multiple cell system, if two cells have the 8th bit set in the same word in each cell, a priority circuit connected to the cells will prevent all but one of the outputs from feeding I/O buffer 18, and clearing the 8th bit. Only one byte will be output at a time, and remaining bytes will be output in later refresh cycles.

After power is applied, a means to fill memory with identical bytes is used to empty the memory. To fill an empty memory with a string of characters, a ripple priority mechanism can be used to modify the basic search and match mechanism so that only the first byte that satisfies the search part is modified, but no other bytes that satisfy the search are altered. Within a single cell, a flip-flop is set as the bytes in the cell are being searched, and is cleared after a successful search is detected. The byte is modified in a successful search only if the flop-flop output is "1". One byte can be written in each refresh cycle by this means. In a multiple cell system, a ripple priority circuit is also used between cells. The priority circuit causes all flip-flops except the flip-flop in the prior cell to be cleared. This prioritized context-addressing mechanism is needed to fill memory with different data in each byte.

Figure 5:
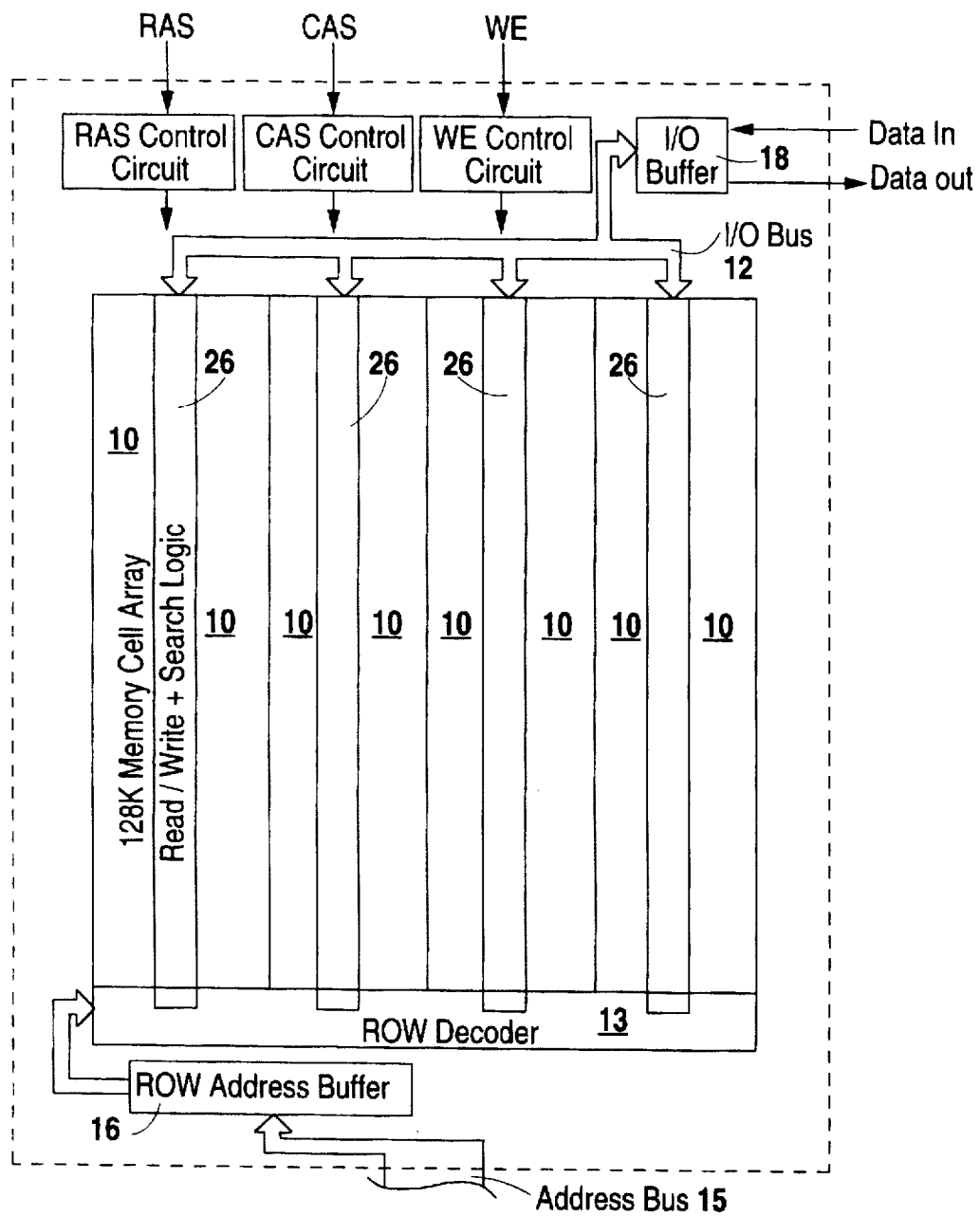
FIG. 5 is a block diagram of a one-megabit dynamic random access memory employing logic in refresh circuitry according to the present invention.

The above-disclosed additional search logic can be easily implemented in existing dynamic random access memories by using preexisting memory cells, row decoders, read amplifiers, write amplifiers and multiplexers but removing the column decoders and inserting search logic including the comparator and comparand register into the read/write circuits. If this is done, for example in the Hitachi HM511000 (a one-megabit DRAM), the entire memory can be read, searched and rewritten in approximately 60 microseconds (the time required to refresh the entire memory). Such a memory is shown in FIG. 5 and illustrates placement of search logic 26. If a system incorporates a number of memory chips, and a string of characters is searched, the time required to search all data in memory will remain 60 microseconds per character searched.

Although content search and update, input and output are the logical operations herein disclosed, it will be understood that other logical techniques can also be implemented. For example, the various techniques used for searching and updating a data base, such a relational data base, as disclosed in "Architectural Features of CASSM; A Context Addressed Segment Sequential Memory," Proc. 5th ISCA, pp 31–38, April 1978, authored by the present inventor, and related work on the CASSM system cited in that paper, can be implemented. Other modifications, additions, or deletions can also be made without departing from the scope of the invention. For example, the present invention is equally applicable to memories, only a portion of which is dynamic memory.

The invention thus allows associative searching of a dynamic memory integrated circuit with a redesign of only a small part (removing column decoders, and adding comparators and comparand registers to the refresh circuitry) of a preexisting chip memory. This results in low development cost, little if any increase in manufacturing cost, and utilization of existing DRAM facilities without the need for extensive retooling. Use of the invention will allow associative searching of very large data bases stored entirely in fast dynamic memory with very little increase in cost over an unmodified dynamic random access memory.

Figure 6:
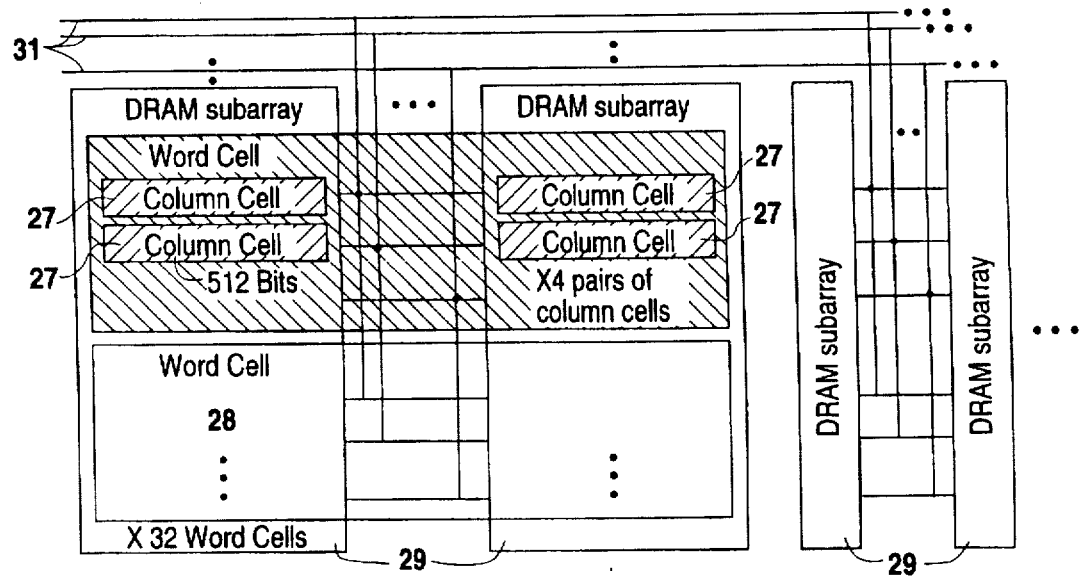
FIG. 6 is another block diagram of a dynamic random access memory employing logic in refresh circuitry according to another embodiment of the present invention.
Figure 7:
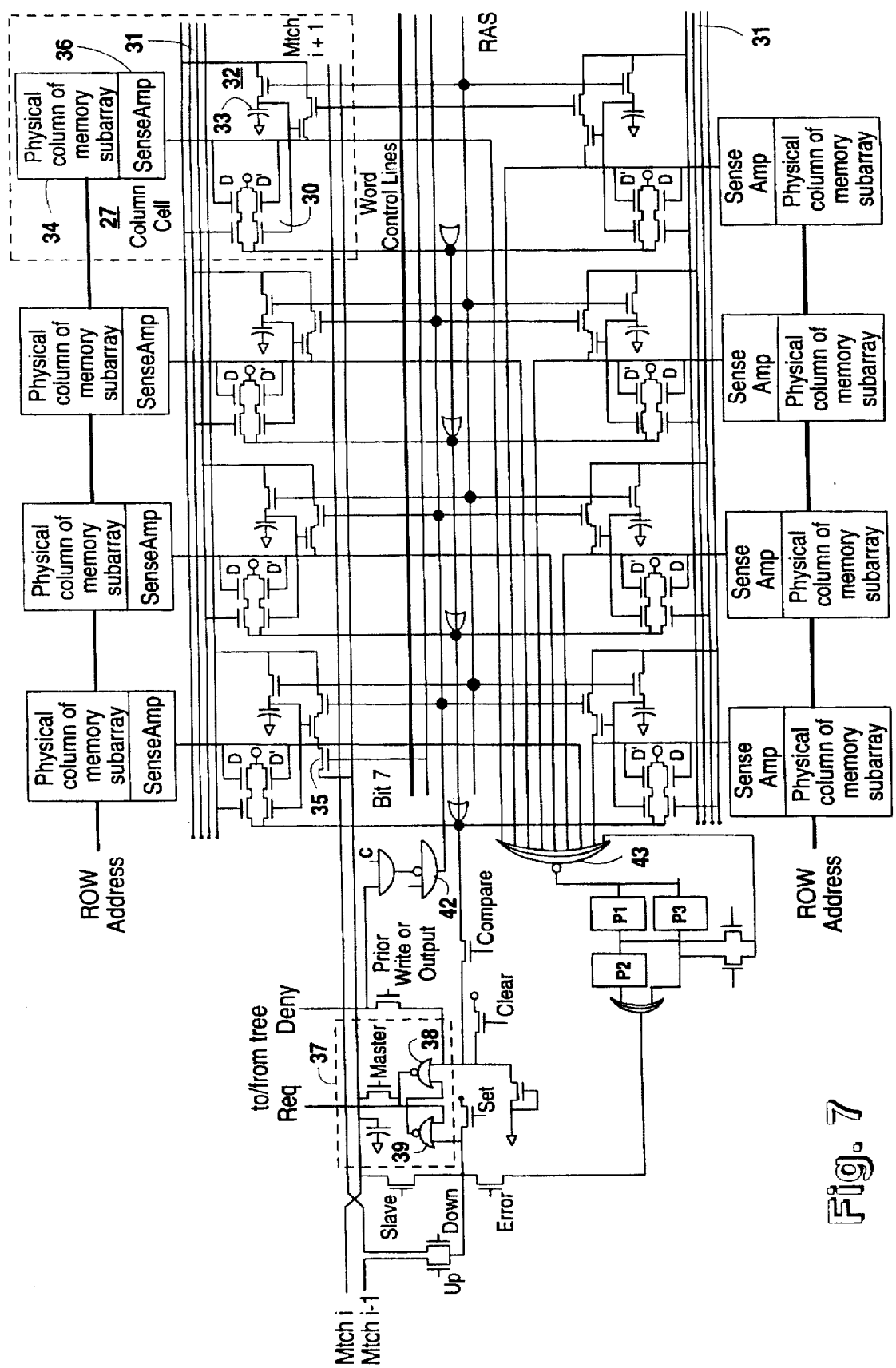
FIG. 7 is a detailed block diagram of a word cell of FIG. 6.

FIGS. 6 and 7 illustrate the organization of a semiconductor chip incorporating another embodiment of the present invention. As mentioned above, it is important to only slightly modify the architecture of an existing DRAM chip (FIG. 1), keeping the memory array intact, so that the cost of modifying the design of an existing DRAM chip to produce the present invention will be small relative to the cost of designing a full chip.

Referring to FIG. 6, in a refresh operation, one column is refreshed sequentially, one bit after another, using one sense amplifier. The data in the column, stored in column cells 27, are collected together in groups of four pairs of column cells each to form word cells 28. Thirty-two word cells are arranged within a pair of existing DRAM subarrays 29, and the chip includes eight pairs 29 of DRAM subarrays. Thus, in a one-megabit memory, each column cell includes 512 bits.

As explained above, in a refresh operation, one column is refreshed sequentially, one bit after another, by one sense amplifier. For simplicity, as shown in FIG. 6, the eight column cells 27 forming each word cell 28 can be considered as four columns in each of two neighboring DRAM subarrays, thereby forming the four-column, two-row rectangle shown to read or write one byte at a time. Of course, any number of column cells per word cell can be used. Connecting each of the column cells is a data bus 31.

Referring to FIG. 7, a detailed block diagram of a word cell used in FIG. 6 is shown. In FIG. 7, eight identically configured column cells 27 are presented. For clarity, only the upper left column cell 27 in FIG. 7 is described. However, it is understood that each of the other seven column cells in FIG. 7 are configured identically. Each column cell 27 includes a mask flip-flop 32 including storage capacitor 33 which stores a mask bit for each refresh cycle. Also included in each column cell 27 is a physical 512 bit memory subarray 34 and dedicated sense amplifier 36. In this embodiment, each column cell 27 also includes a four transistor comparator 30. The output of each word cell is commonly connected in a wire-OR configuration to a dual-rank (master slave) set-clear match flip-flop 37 which includes two NOR gates 38 and 39 whose inputs are set and clear inputs of flip-flop 37. Capacitor 41 within flip-flop 37 is the slave of dual-rank flip-flop 37.

As noted earlier, a refresh cycle is a period of time required to refresh one bit of one column with one sense amplifier, and is performed simultaneously for each column in the memory. A refresh cycle is divided into a row address strobe time (TRAS), where row address strobe is asserted, and a column address strobe time (TCAS), where column address strobe is asserted. TCAS is distinct from and after TRAS. Also as noted earlier, a refresh operation is the period of time required to refresh all bits within a single column.

According to the present invention, during TRAS, a mask is sent on data bus 31 and is stored in mask flip-flop 32, and during TCAS, data is sent on data line 31. This is directly analogous to the time-multiplexing of row address and column address in a convention DRAM. In a refresh operation, the large (4096-bit) data and mask values are time-multiplexed on 8-bit data bus 31. For example, if in a refresh operation, the data value is a 4096 hexadecimal bit value of the form, for example, 1234...., and the mask value is a 4096 hexadecimal bit value, for example, 5678...., then in the first refresh cycle in the refresh operation, hexadecimal 56 is sent during TRAS, and hexadecimal 12 is sent during TCAS. In the second refresh cycle of the refresh operation, hexadecimal 78 is sent during TRAS, and hexadecimal 34 is sent during TCAS, and so forth. In all, 512 pairs of bytes are sent sequentially as they are used to search or write data as it is being refreshed inside each word cell. In a write step, the pair of bits sent in the same position in the data and mask bytes during TCAS and TRAS will be "10" when the comparand value is a "0," "11" when the comparand value is a "1" and "00" when the comparand value is a "don't care." In a compare step, however, in order to reduce comparator logic, the pair of bits sent during TCAS and TRAS will be "01" when the comparand value is a "0," "10" when the comparand value is a "1," and "00" when the comparand value is a "don't care."

According to the present invention, when the circuitry of FIG. 7 is added to the refresh circuitry of a DRAM, an associative memory structure is presented that allows the associative searching of data within the memory as it is being refreshed.

Specifically, a No-op instruction, which does nothing but refresh the memory for one refresh operation, is accomplished by amplifying data with sense amplifier 36 and writing that data back into the memory cell 34 without modification. No data go to or from data bus 31.

During a Word Compare instruction, a data and mask value bit is used for each column, and each column is searched for all words in all memory chips during one refresh operation. A match bit for a word is set if for each column that the mask bit is 1, the data bit is the same as the bit in the word and column. More specifically, for a Word Compare instruction, match flip-flop 37 is set to "1" at the beginning of the refresh operation. In each refresh cycle, the mask and data are sent, the left bit being sent first during TRAS and stored in mask flip-flop 32 in each bit cell, with the right bit being sent during TCAS. If the word has a "0" and the first bit is a "1," then match flip-flop 37 is cleared. If the word has a "1" and the second bit is a "1," then match flip-flop 37 is cleared. The control signal Compare is asserted at the end of the refresh cycle when comparator 30 has stabilized, to clear match flip-flop 37 if a mismatch is detected. Data in a cell are refreshed during a Word Compare instruction.

During a Word Write instruction, three-input AND gate 42 is utilized. The mask data stored in mask flip-flop 32 and sensed data are sent during TCAS and are used to rewrite data in the cell. If in a word cell the Mask and Match bits are both high, data are rewritten into the cell. Otherwise, data in the cell are refreshed. During a Word Output instruction, during TRAS, a high signals is sent on data bus 31 so as to output all bits. During TCAS, the Word Write instruction is asserted and data from sense amplifier 36 are applied to data bus 31 and are also refreshed in the cell.

For the next set of instructions, words are considered linearly ordered (top to bottom) and prioritized (higher words are considered to be of higher priority). In addition, the first of these instructions take advantage of the word structure mentioned earlier wherein the most significant bit in a word is a mark bit distinct from the character bits of a byte.

During a Character Compare instruction, the master of match flip-flop 37 is initially set and the Word Compare instruction is executed on the whole byte to clear match flip-flop 37 if there is a mismatch where the mask bits are "1." Then, the slave of match flip-flop 37 is written into the mark bit (high-order bit) of the next byte using extra transistor 35 (by delaying the signal from the slave match flip-flop 37 in one refresh cycle time), and finally, the master of match flip-flop 37 is copied into the saved flip-flop. Data are refreshed in a Character Compare step.

In a Word Compare Up instruction, the Word Compare instruction is executed during each refresh cycle of a refresh operation. The contents of the match bits are then shifted upward one bit logically at the end of the refresh operation.

Similarly, a Word Compare Down instruction executes the Word Compare instruction during each refresh cycle of a refresh operation, and then, at the end of the refresh operation, the contents of the match bits are shifted downward one bit logically. A Word Compare Prior instruction executes the Word Compare instruction during each refresh cycle of a refresh operation, and then clears the match bits downward from the first one that is set at the end of the refresh operation.

To execute a Word Output instruction, for the prior word cell having the match bit set, one refresh operation is used to output one word, and at the end of each refresh operation, the match bit of the word ouputted is cleared. The Word Output instruction is repeated until all match flip-flops are cleared. To execute a Word Write instruction, for the prior word cell having the match bit set, for each refresh operation, a word is written and the match bit is cleared. The operation is repeated until all match flip-flops are cleared.

A typical instruction begins with the transmission of an appropriate instruction code on the data lines during a period of time that the memory executes a No-op cycle. As mentioned above, during each refresh operation, 512 refresh cycles occur, and the instruction is executed during each of the refresh cycles.

The memory requires comparand data to be supplied very rapidly. Data to and from the memory could be supplied by a video RAM, or by use of a technique known as "shuttle memory," wherein a pair of static RAMs are connected by multiplexers to the associative memory and a conventional host computer so that when one is connected to one the other is connected to the other. As the computer rewrites data in one static RAM, a fast counter addresses the other to read or write consecutive words in it to or from the associative memory during one refresh operation. At the end of the refresh operation, the pair are exchanged, thus shuttling the static memories to and from the associative memory and computer.

Figure 8:
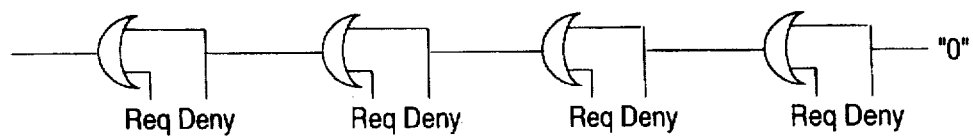
FIG. 8 is a chain priority circuit usable in the present invention.
Figure 9:
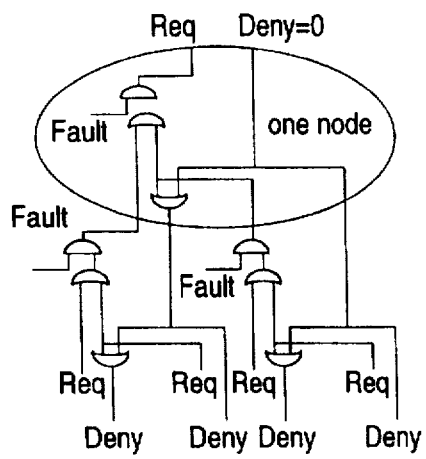
FIG. 9 is a priority tree circuit usable in the present invention.

To facilitate multiple cell operations, particularly during execution of the Compare Prior, Write, and Output instructions, a priority line is required. Priority selection can be understood in a chain of OR gates, as illustrated in FIG. 8. A request causes a "1" to ripple through the OR gates leftward, causing any request there to be denied. This priority chain is implemented according to the preferred embodiment using a lookahead binary tree for speed and fault-tolerance. FIG. 9 shows a two-level tree. A deny equals "0" is put into its root, and Request and Deny of the leaf nodes are connected to match flip-flops 37 (FIG. 7). The Compare Prior instruction can clear non-prior (denied) match flip-flops. The effective match value used in Write and Output instructions has to be true in only one cell, the prior cell. Three-input AND gate 42 cancels a match in non-prior cells in input C1 is asserted.

Figure 10:
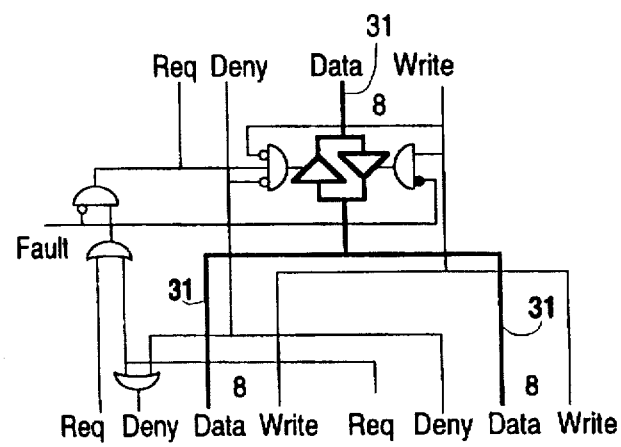
FIG. 10 is a node in a data bus and priority tree usable in the present invention.

A priority network for data bus 31 is shown in FIG. 10 and is a binary tree of bidirectional bus drivers controlled by the priority tree of FIG. 9. The root of the priority tree of FIG. 10 is connected to an external controller having a shuttle memory, and the leaves are connected to word cells. When data is sent to the cells, all leaf-ward directed bus drivers are enabled and all root-ward directed bus drivers are disabled. When data are collected from the cells, the opposite is true. The match value determines the prior cell, which outputs data. Note that the priority tree of FIG. 10 can be used to guide data in data bus 31.

Referring once again to the circuit of FIG. 7, appearing in the lower, right-hand corner thereof is a simple errordetection circuit, which uses one parity bit for all of the data bits in a word cell. All of the column cell data lines are connected and input to exclusive-OR gate 43. At the beginning of a refresh operation, dual-rank flip-flops P1 and P3 are initialized to zero, and early in a refresh cycle, flip-flop P3 is loaded with the exclusive-OR of all eight data bits that are read from memory along with the old value of P3. Later in the refresh cycle, flip-flop P1 is loaded with the exclusive-OR of all eight data bits that are written into memory along with the old value of flip-flop P1. At the end of a refresh operation, flip-flop P1 contains the parity of all the data bits that have just been stored in the cell's memory. The output of flip-flop P1 is stored in flipflop P2. At the end of a refresh operation, flip-flop P3 contains the parity of all the data bits that have just been read back from the cell's memory. The parity computed and stored in flip-flop P2 should match the parity computed and stored in flip-flop P3. If the computed parity in P2 differs from the stored parity in P3, there is a parity error in the data. The error signal is applied to the master of match flip-flop 37 when the match bit is stored in the slave of match flip-flop 37 at the end of a refresh operation.

Faulty cells can be handled by pruning the trees used for next neighbor connection in the bus. By asserting the fault line (FIGS. 9 and 10), data bus 31 is pruned to isolate an error in a subtree, forcing open both tri-state drivers in the link above the subtree, and the priority tree is pruned in a node above the faulty tree, forcing a request of "0" into the rest of the tree.

It is believed that the cost of the modified associative DRAM chip according to the present invention will be similar to the cost of current DRAMs. A typical DRAM sense amplifier has six transistors, and its column address decoder has four transistors. Removing the column address decoder, as required by the present invention, and adding one bit of mask, a comparator, and a parity checking exclusive-OR gate (together implemented with approximately eleven transistors), slightly increases the sense amplifier size. According to the present invention, each word cell has a match flip-flop, parity checking flip-flops, and associated logic requiring approximately 35 transistors, and for each word cell there is a node of the priority tree, requiring approximately six transistors. Amortizing this word cell logic over the total number of sense amplifiers in the word cell, on the order of five additional transistors would be required per sense amplifier. Thus, the present invention would require approximately 24 transistors per sense amplifier, thereby only slightly increasing the required integrated circuit chip area. Moreover, since address pins are omitted, a chip embodying the present invention could be packaged in an 18-pin package (VDD, VSS, RAS and CAS clock and a signal to indicate the start of a refresh operation, a write signal to control the data bus direction, two shift pins, request-deny signals, and eight data lines). Thus, according to the present invention, searching of an associative DRAM is accomplished using circuitry integrated within the refresh circuitry on the same integrated circuit chip as the memory array. That results in highly parallel logical operations being performed on data in memory cell arrays, in addition to using the high-bandwidth data paths that exist in refresh circuitry.

The above-described circuit can be used in a storage system as a buffer to facilitate the searching of data that are read from a non-volatile storage device, such as a hard disk. Use of such a system permits parallel searching, shortening the time needed to access and locate information that had been read from the disk. Although the following description refers to one particular kind of hard-disk system, the invention has equal application with any kind of storage system, including tape drives, optical storage, other kinds of hard disks, floppy disks, so-called "flash" memories or any other kind of non-volatile storage device, presently existing or later developed, and whether or not buffered with intermediate volatile storage.

FIG. 11 illustrates a hard-disk embodiment of the storage system of the invention. Hard disk 51 contains a series of disk surfaces or platters 51a, 51b, through 51n, on which a series of heads 53a, 53b, through 53n record data on, and read data from, tracks and sectors arranged in any known design. Any number can be used for the subscript "n." One type of high-capacity disk 51 is the 1.5-gigabyte Winchester hard drive manufactured by Maxtor Corp., which has n=19 storage surfaces, but drives with greater or lesser capacity or number of platters and heads are suitable. Switchable bus 61 connects disk drive 51 to computer 65 and memory banks 73 and 75, which are described in more detail below. A second switchable bus 67 connects computer 65 to memory banks 73 and 75 and is also described below.

Figure 12:
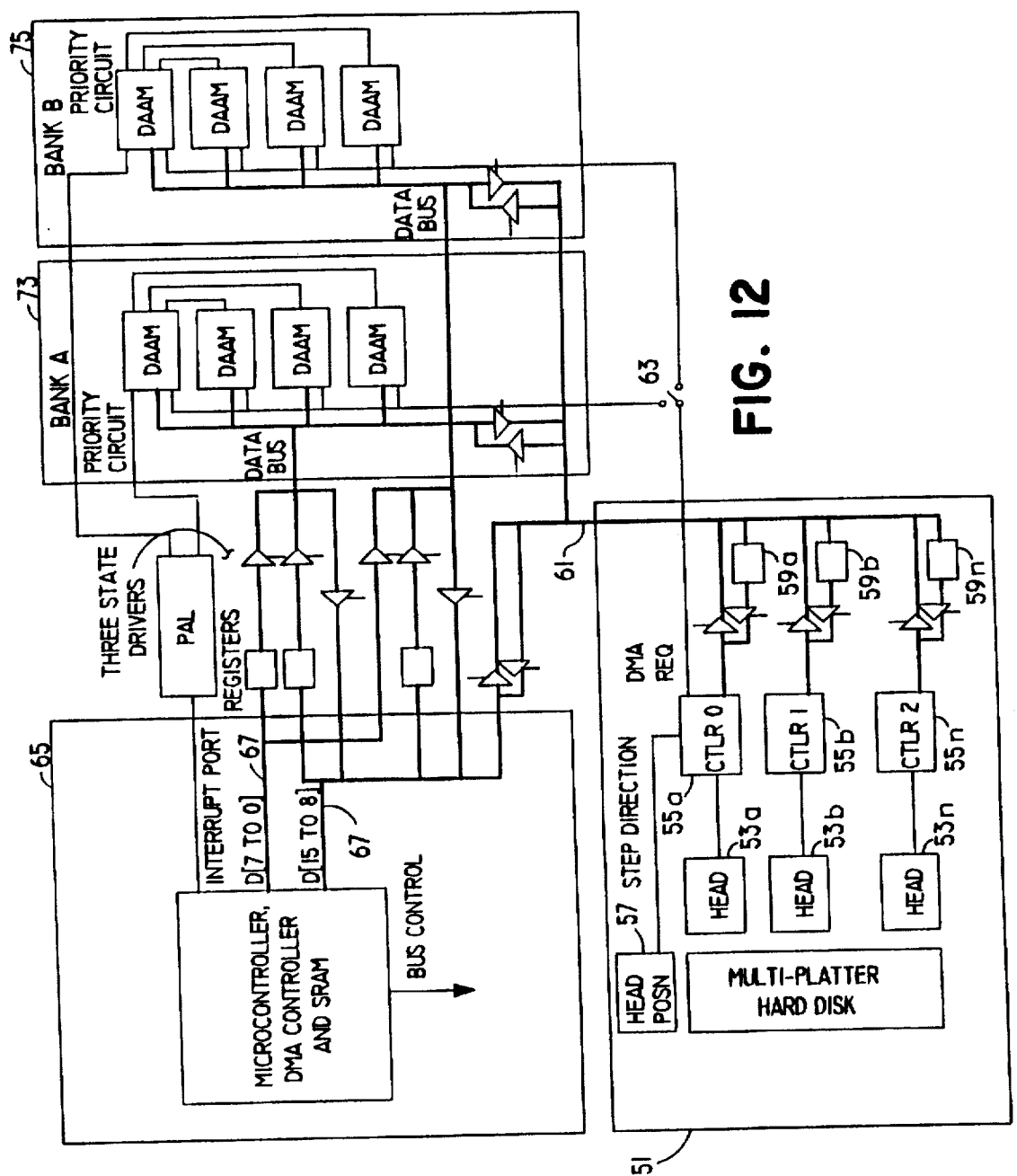
FIG. 12 is an example block diagram of an embodiment of the module of FIG. 11.

Heads 53 are controlled by hard disk controller circuitry 55a, 55b, through 55n, shown in FIG. 12. Controller 55a can comprise a disk controller of known design, which contains read-write logic and head-positioning control, often integrated onto a single chip. Controller 55a can make DMA requests and can control a stepper motor or other head-positioning device 57, which may also contain an indexing sensor. Thus, disk drives of standard design include platters 51, heads 53, controller 55a, and head motor 57.

By contrast, the system of the invention also includes additional controllers 55b through 55n, each of which is associated with and controls one of heads 53b through 53n. The additional controllers must be capable only of governing the read and write operations of their associated heads. The positioning and DMA-request functions of a standard controller are performed in the system of the invention entirely by controller 55a, and controllers 55b through 55n act as "slaves" to the master controller 55a. Controllers 55b through 55n need not include, therefore, all of the circuitry of master controller 55a, but it may be economically desireable to use mass-produced controllers for each of controllers 55, in which case the control signals outputted by controllers 55b through 55n can be disabled or ignored.

In sum, the disk portion of the invention utilizes a standard disk drive, modified to contain additional controllers 55b through 55n. Those controllers perform the added function of reading or writing data in parallel from a "cylinder," which for the purpose of this patent means the same track and sector located on the set of all of the platters 51a through 51n.

For purpose of the invention, it is preferable to store data on the disk in a "striped" fashion, in which adjacent elements, such as a byte, are recorded on adjacent platters within a cylinder. For example, byte number one would be located at a first address on platter one of a cylinder, byte two would be located at the same address on platter two of the same cylinder, byte n would be located at the same address on platter n of the same cylinder, byte n+1 would be located at the next address on platter one of the cylinder, etc. The elements can comprise a single bit, several bits, or several bytes, instead of the single byte of data as described above. Such "striped" data arrangements take full advantage of the parallel capabilities of the system of the invention.

FIG. 13 is a timing diagram showing an example timing for extracting data from disk 51. At the beginning of the cycle, controller 55a positions the head and each of controllers 55 read a byte's worth of data and store it in temporary registers 59a through 59n (shown in FIG. 12) for an entire cycle. Each byte is then placed on multi-line data bus 61 sequentially from those registers until the cycle is complete. Other arrangements are contemplated, including systems that utilize staggered reads. The process is simply reversed when the system is used to write data back onto disk 51.

Returning to FIG. 12, computer 65 controls switch 63 to direct the data on bus 61 to one of two memory banks, Bank A shown at numeral 73 or Bank B shown at numeral 75. Two memory banks are used in the embodiment shown to allow the system to fill the second bank with data while computer 65 interrogates the first bank. Although two banks are shown, the invention can be practiced in a simplified version with only a single bank or in a more complex version with more than two banks.

In the embodiment shown, computer 65 contains a microcontroller, a DMA controller, a suitable non-volatile program store, and a suitable memory such as a quantity of static RAM. Those elements are integrated in some devices, such as the "Business Card Computer" sold by Motorola, which contains a Motorola 68340, but other devices or combinations are suitable.

Computer 65 alternates contact between data bus 67a leading to memory bank A and data bus 67b leading to memory bank B. The arrangement is illustrated in FIG. 14, in which the system is illustrated in a particular state. Disk 51 in FIG. 14 is shown filling bank B 75 through bus 61b. Meanwhile, computer 65 interrogates bank A 73 through bus 67a.

Bus control is accomplished by altering the state of a number of tristate drivers, shown in FIG. 12 as small triangles. The following specific parts are suitable: the 244 unidirectional tristate bus driver, the 245 bidirectional tristate bus driver, and the 373 latch or register with tristate output. As one memory bank reaches its capacity, computer 65 switches buses 67 to contact the filled bank, flips switch 63 to connect controller 55a to the other bank, and switches bus 61 to permit data to begin filling the other bank.

Figure 15:
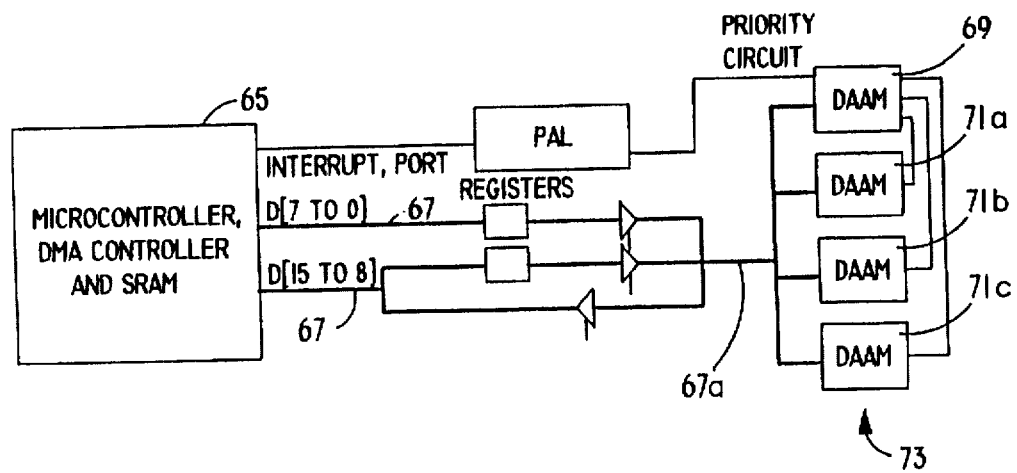
FIG. 15 is a block diagram illustrating a portion of the circuitry of FIG. 12, including principally the portion that relates to searching data in the memory of the invention.

FIG. 15 reproduces a portion of the circuitry of FIG. 12, isolating only one of the memory banks 73 and 75 and its associated bus, namely the bank and bus in contact with computer 65 at a particular time. The example illustrated in FIG. 15 shows computer 65 in contact with bank 73 along data bus 67a. The other memory bank and bus, and the disk elements and bus 61 loading it, are omitted in the simplified version of FIG. 15.

Each bank 73 and 75 contains one or more dynamic associative memory devices ("DAAM"), preferrably as described in detail in connection with FIGS. 3 through 10, above, or another form of content-addressable memory, in which the data may be searched for a match while in the memory. FIGS. 12 and 15 show four DAAMs per bank, labeled in FIG. 15 with numerals 69 and 71a through 71c. In the sample embodiment of FIG. 15, a tree topology connects the DAAM to implement a look-ahead priority circuit, where DAAM 69 serves as the root and acts as one leaf of a tree, with DAAMs 71 as other leaves. The tree structure has the same purpose and benefits as that used inside the DAAM chip, described in connection with the description of FIGS. 7 through 10, above. Also, the priority circuitry of FIGS. 12 and 15 serves the same function as the similar circuitry within the chip shown in FIGS. 7 through 10.

Figure 2:
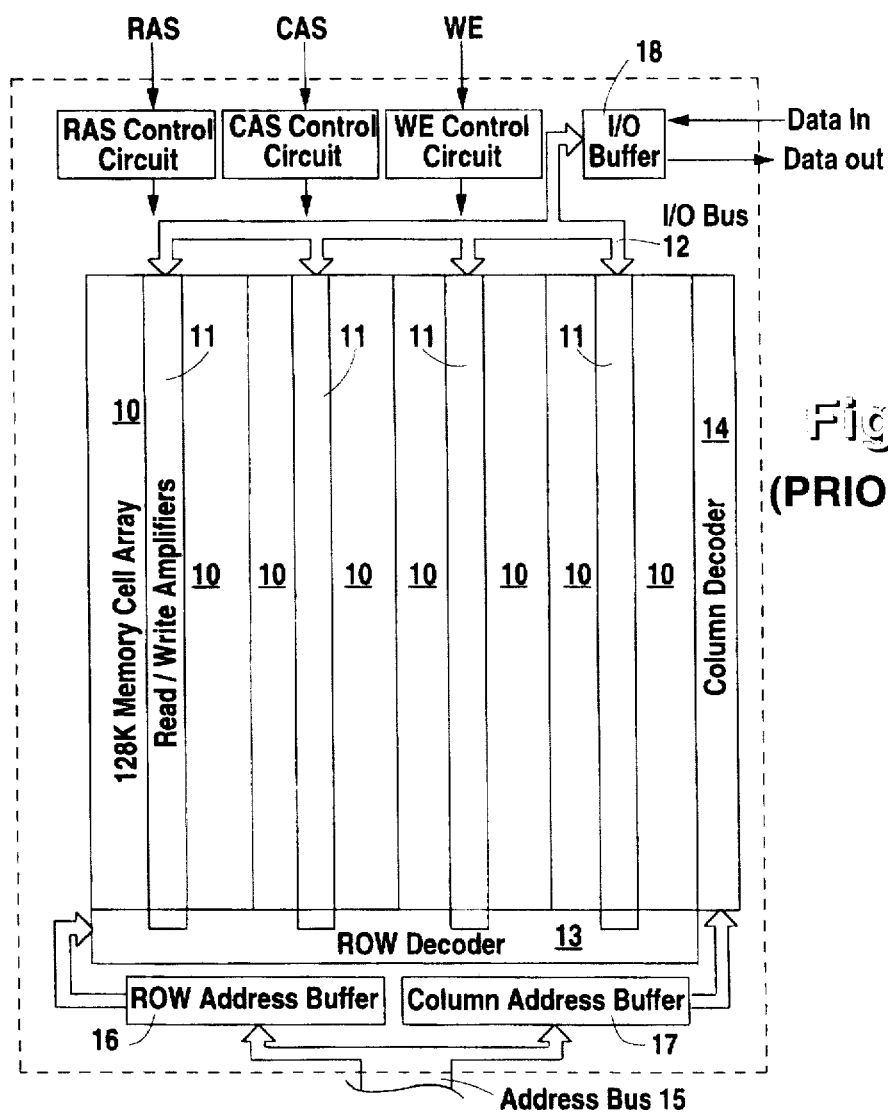

DAAMs 69 and 71 in FIGS. 12 and 15 can be replaced with a single DAAM device, depending on the access rates of disk 51 and DAAM 69 and the number of platters 51a through 51n. In particular, one DAAM chip such as that shown at numeral 69 can receive data from at most the number of controllers 55 equal to the integral portion of the ratio of the bandwidths of DAAM chip 69 to controller 55. For example, the one-megabit DAAM described above in connection with FIG. 2, which is designed to use the Hitachi chip as its base, has a cycle time of about 120 nanoseconds across an eight-bit bus, which results in a bandwidth of 8.3 Mbytes/sec. The controller on the Maxtor hard disk referred to above can read data at a rate of about 2.0 Mbytes/sec. Thus, each DAAM chip of the sort identified above can be fed by at most four controllers of the sort used in that kind of disk drive. Therefore, the 19-platter Maxtor drive would require at least five DAAM chips. A DAAM chip that operates 2.3 times as fast and uses a 16-bit bus, however, could be fed by all of the 19 platters on the Maxtor drive, without the need for a second DAAM device in the bank.

There is a second constraint, however, on reducing the number of DAAM chips, namely the desire to avoid slowdown of the system by having sufficient storage capacity. It is most efficient to read entire cylinders from the disk at once, but to do so requires that the bank contain sufficient storage capacity.

Even if there is sufficient bandwidth available to fill the DAAMs, unless the DAAMs contain enough capacity, the system designer would likely wish to add extra DAAMs to each bank rather than slowing down the reading operations by reading only part of the cylinder into the bank on each step. For example, a preferred system design for the above-referenced Maxtor drive would require enough DAAMs in each bank to store the approximately seven megabits on each of the drive's cylinders, or eight units of a one-megabit DAAM. If those DAAMs operated only as fast as the ones described above using the Hitachi chips, however, the system would be bandwidth constrained. A preferred system design would be neither capacity constrained nor bandwidth constrained, allowing the user to upgrade the disk drive to one having somewhat faster output speed or somewhat larger cylinders, without replacing the DAAMs or associated circuitry.

If a number of DAAM chips are used in each bank, the data on disk 51 can be arranged in a staggered fashion across disk channels, where each disk channel is defined as one DAAM chip, the controllers to which it is connected, and the platters controlled by those controllers. In that alternative arrangement, data would be arranged with the first byte at a given position on platter one of a given cylinder, the second byte at the same position on platter five of the same cylinder, etc., where the system was arranged with one DAAM chip 69 or 71 controlling four controllers, such as 55a through 55d.

Figure 16B:
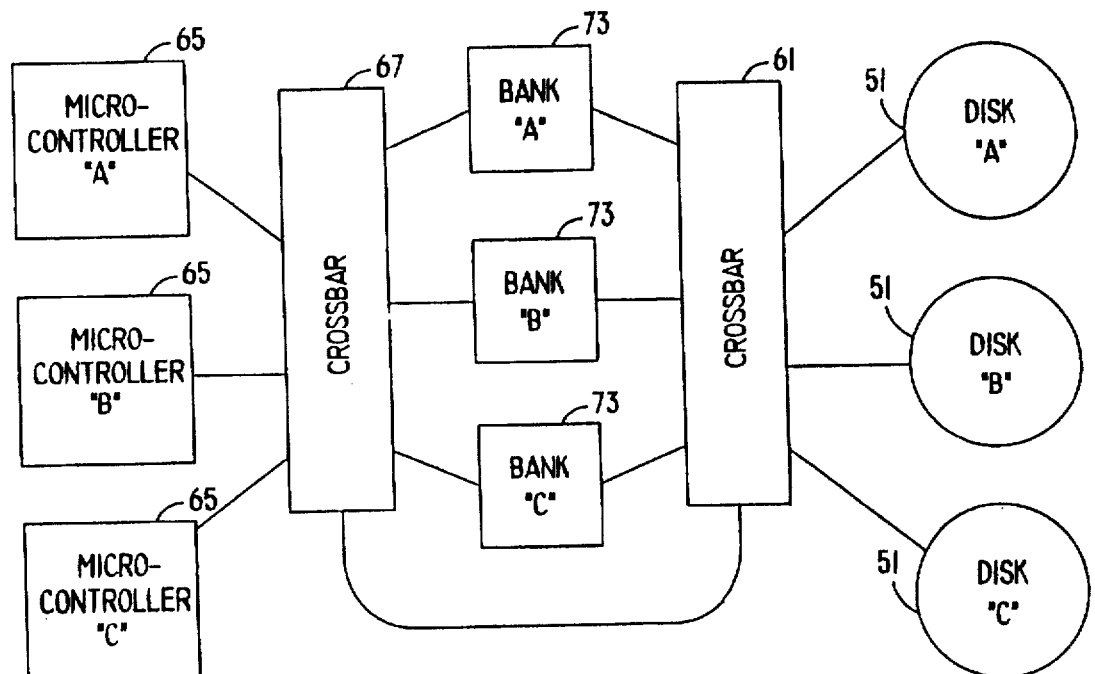
FIGS. 16a and 16b illustrate three alternative systems, each of which contains several modules that can consist of the embodiment of FIG. 12 or another system in accordance with the invention, arranged with alternative connecting mechanisms.
Figure 16A:
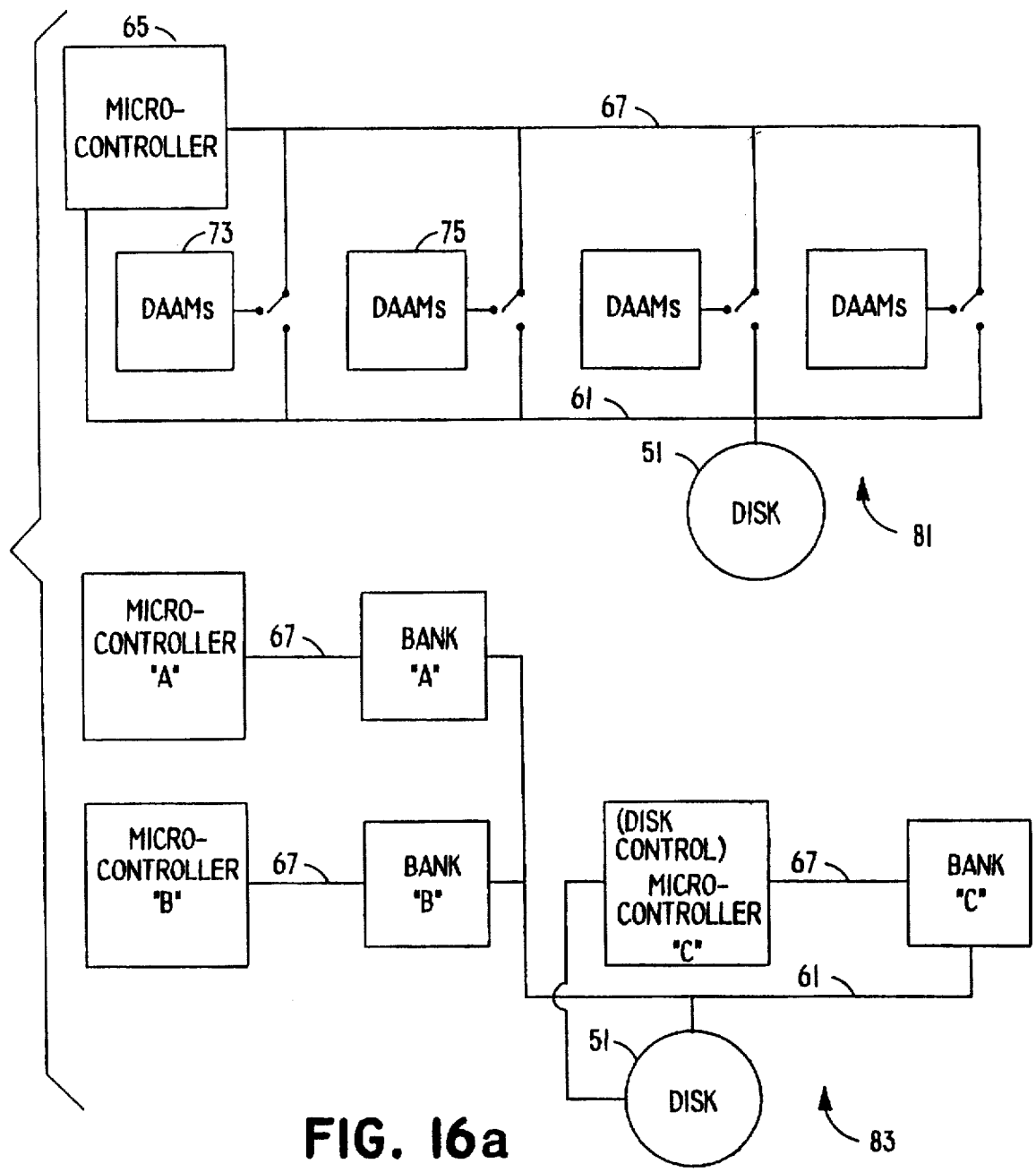

The system of the invention can constitute one of a number of modules, each of which can contain one of the modules as illustrated in FIG. 12 or otherwise in accordance with the system of the invention. FIGS. 16a and b illustrate several examples of such modular arrangements. In system 81, a larger number of banks containing one or more DAAMs are arranged in a parallel structure. In system 83 of FIG. 16a, two computers interrogate one bank of memory each while the disk fills a third bank. An arbitrary one of the microcontrollers, there controller "C," also acts as a disk controller. Any of the microcontrollers can be dynamically allocated to control the disk, but FIG. 16a shows only one possible connection, for clarity. Additional computer-memory pairs can be added, subject to disk access constraints. In system 85 of FIG. 16b, a number of computers, memory banks, and disks use a multistage interconnect network such as a one or more crossbar switches to implement buses 61 and 67 in FIG. 12. The interconnection network can be configured to permit any disk or any computer to access any memory bank. Any of the microcontrollers can control any of the disks by communicating through the bus connecting crossbar 67 to crossbar 61. System 85 can also include a configuration in which the multistage interconnect network is arranged in a hierarchical system.

The system of the invention can accomplish standard disk data and housekeeping operations. Data can be altered by computer 65 while located in DAAM 69 or 71 and written back onto disk 51 upon command, using the reverse of the disk-reading operation described above in connection with FIGS. 12 and 13. New data can be added to free space at the "bottom" of any of DAAM 69 or 71, and written to disk 51 at any free space on a cylinder. Data tagged for deletion can be deleted by sequentially reading and rewriting all of the data on the disk, such as at an off-hour. As the data are read, the garbage items are blocked from being placed into memory by issuing a NOP command to the DAAM when a tagged item is read from the disk. Next, the contents of the DAAM are written back onto the disk, overwriting the old data with only data not tagged for deletion, thereby condensing the data and deleting the garbage.

The memory of the invention can be readily used for full-text retrieval operations, particularly although not necessarily in conjunction with the disk-based embodiments shown in FIGS. 12 or 16. In such uses, it is desireable to arrange the data in a fashion that takes advantage of the parallel search capabilities of the memory.

Figure 17:
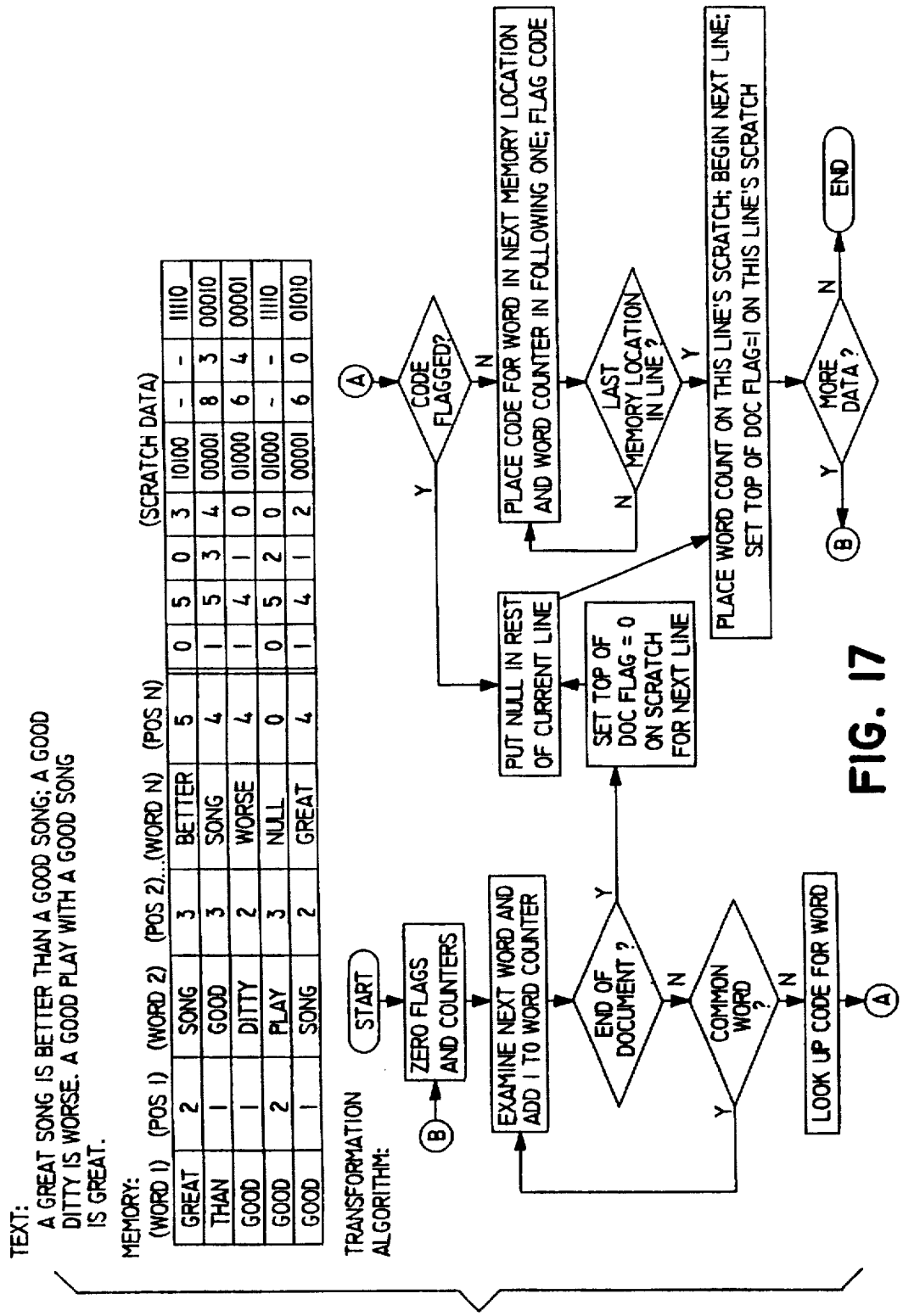
FIG. 17 is a diagram illustrating one possible storage structure within the memory of the invention.

Although other systems are possible, FIG. 17 illustrates an example arrangement of sample data within the memory of the invention. In the illustrative system, each word of memory is divided into a series of atoms, each of which contains one data word, such as an English word, and associated data. For simplicity and avoiding of terminological confusion, it is assumed in connection with the description of FIG. 17 that each row of memory stores one logical associative memory "word," although as noted above, that assumption is not a necessary one.

The number of atoms in each row is predetermined and set so as not to fill the entire row with the data, thus setting aside some additional storage in each row to serve as "scratch" locations at the end of each row. The example in FIG. 3 shows three atoms per word, but it is both feasible and desireable to use a greater number of atoms in a wider word.

Each atom contains a fixed number of bits for storing a data word, called a field, and another fixed number of bits for storing data associated with the data word in another field. In the example shown in FIG. 17, the associated data includes only the position of the word in the document, but other data can also be stored, some examples of which are described below.

In the coding system illustrated in FIG. 17, the memory is loaded by placing a unique code representing the data word in the first field of the atom, in which the code is determined from a table that contains all of the English words that are used in the document. The table can be pre-filled with likely words and additional words added when a new word is encountered. Although binary code words, not letter codes such as ASCII codes, are stored in the memory, the memory map in FIG. 17 uses letters for ease of display.

As each data word is encountered, the device avoids loading common "stop" words, such as "a" and "the." A counter is incremented, however, for all words, including stop words. For each loaded data word, the contents of the counter is placed in a field of the atom immediately after the loaded data word. The location counter is zeroed at the beginning of each row and copied into a predetermined scratch data field at the end of each row. In FIG. 17, the second column in the scratch field to the right of the double line indicating the start of the scratch data, is reserved for the number of data words in the row.

Thus, each atom contains both a data word and an indicator of the position of the word in the data. Because the count is restarted in each row, the position indicator specifies the position of the data word relative the beginning of the row. The scratch field contains the total number of words in the row. It is also notable that the position indicator and the counter is different from the memory location, that is the atom number in the row, because of the deletion of stop words. In addition, the scratch field containing the total number of words can differ from the position indicator in the last atom storing a data word, if there are "stop words" after the last stored data word. For example, in the second line of FIG. 17, the last data word, "song," is at position four, but the stop word "a" follows it, resulting in the row counter being set at five.

Data words are loaded into the atoms of a row, in the example of FIG. 17, until the end of the row is reached, the end of the document is reached, or one of the data word codes is repeated, whichever comes first, at which point the device begins filling the next row. The embodiment of FIG. 17 prevents a row from containing more than one occurence of any data word, which is useful in searches, as shown below.

A "document" can be defined as desired by the user. In one system, for example, a new document can be started at the beginning of each English sentence, and that method is illustrated in FIG. 17. In other embodiments, it may be desired to consider documents as actual text blocks, such as a newspaper article, memo, letter, page, or other unit, whether of fixed or variable length. In the embodiment of FIG. 17, a column of scratch data is reserved for a flag indicating the top of a document, illustrated in FIG. 17 as the first column to the right of the double line, which contains a zero for all rows that begin a new document.

The invention contains circuitry, which is described above, for comparing an associative memory data word with a comparand during a refresh operation, allowing for parallel searching of all data in a row. That circuitry can be used to match any portion of the contents of the atoms in a row. A related instruction searches for matching data words and, if a match is found, transfers data located an offset number of bits away to a specified location. That Compare and Transfer instruction greatly facilitates searching by locating a data word in a row, and if it is found, transferring the position of the data word in the document, relative to the beginning of the row, to a specified location in scratch.

Figure 18:
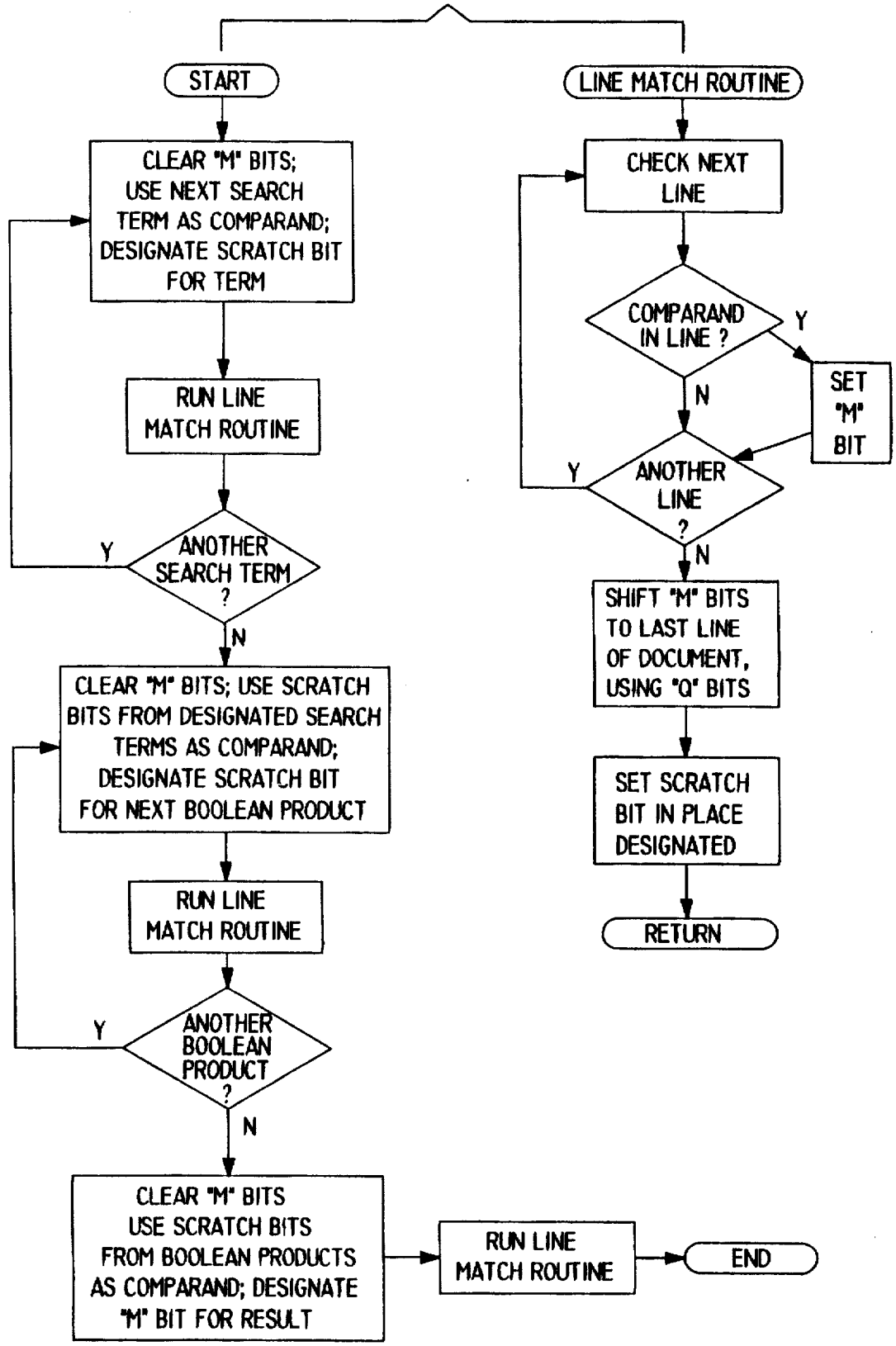
FIG. 18 is an example flowchart illustrating a program for implementing a Boolean search using the embodiment of the invention described in FIG. 17.
Figure 19:
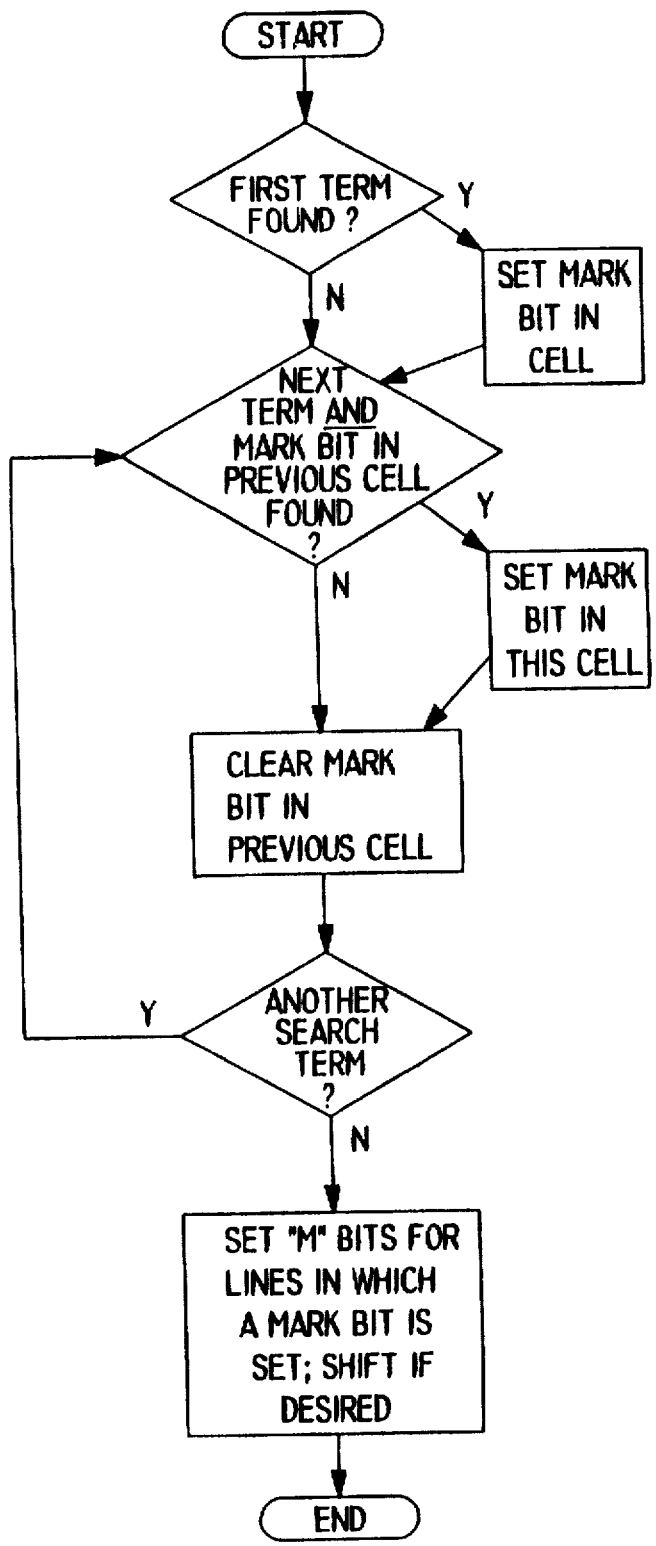
FIG. 19 is an example flowchart illustrating a program for implementing a string search using the embodiment of the invention described in FIG. 17.
Figure 20:
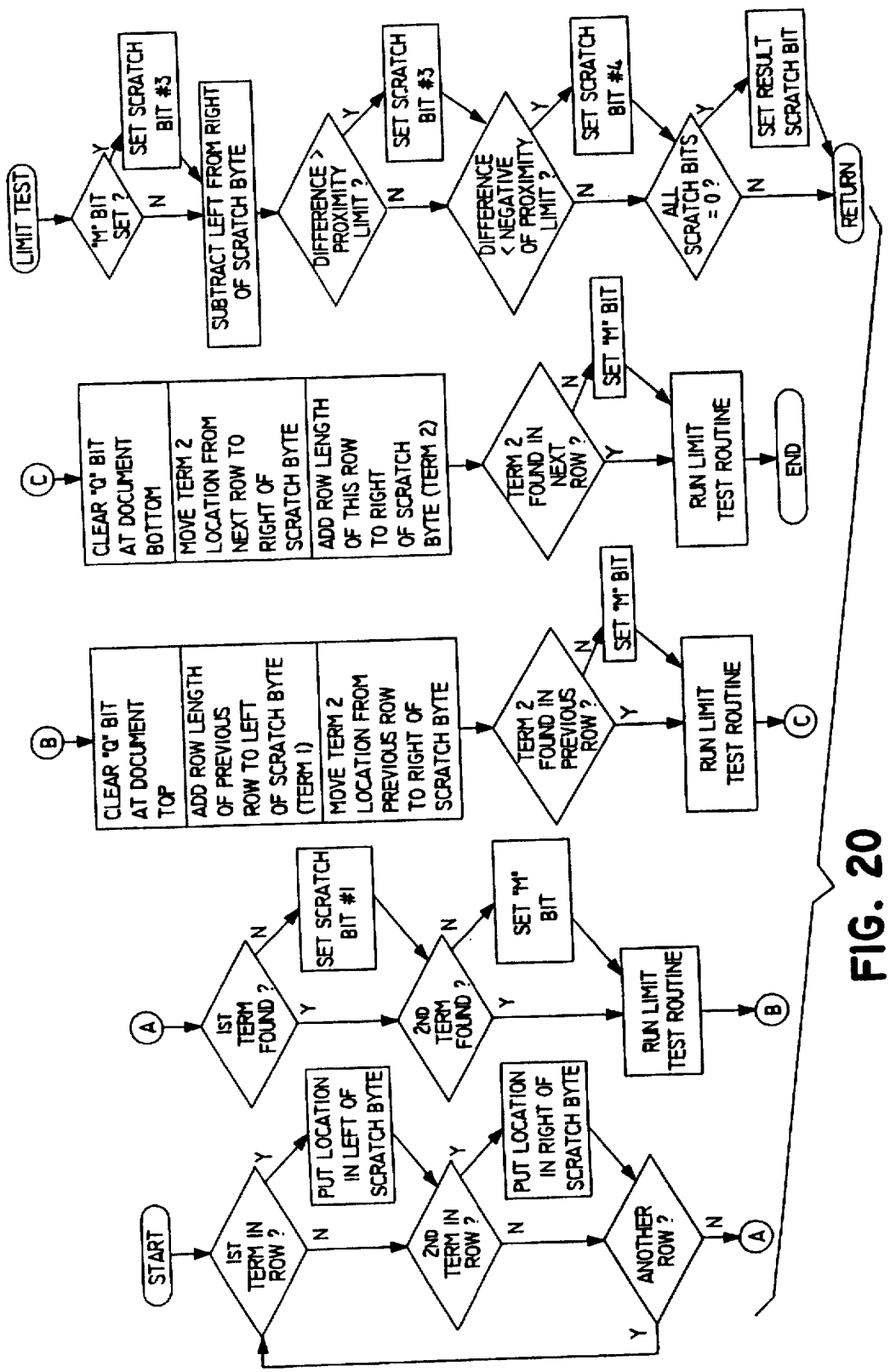
FIG. 20 is an example flowchart illustrating a program for implementing a proximity search using the embodiment of the invention described in FIG. 17.

FIGS. 18 through 20 show several examples of problems common to database manipulation and full-text retrieval, illustrating how the invention permits easier or faster solutions to those problems.

FIG. 18 illustrates a flowchart describing a sample program implementing a Boolean search using the embodiment of the invention described in FIG. 17. The problem is to determine if a series of terms (t1 . . . tn) are located, in a predetermined logical relationship, in a document. The relationship may constitute any combination of Boolean logic, however complex. For example, the user may wish to query the database to find all documents discussing the relationship between music and mathematics but not dealing with computer music, by asking for all documents (whether sentences or memos) that contain the terms "song" or "music" and "mathematics" but not the term "computer."

First, the top of document flag is transferred to a single flip-flop associated with each row, known as the qualify bit, which is used to prevent data from being shifted across document boundaries. Next, the compare instruction is used to determine if the first search term ("song") is present in each row. Each row in which the term is located is marked by setting another flip-flop located adjacent to each row, known as the match bit "M." Next, the M bits for all rows are shifted down and combined with the adjacent M bit with a logical "OR" function, except for those rows in which the Q bit has been set to indicate the top of the document. The shift and combine process is reiterated enough times to exceed the maximum possible number of rows in a document, after which the M bit of the last row of each document will contain an indication of whether the term has been found.

The last-row M bits are transferred to a first scratch bit in the scratch field. The M bits are cleared, and the process is repeated for each search term, resulting in additional scratch bits being set.

Next, the M bits are cleared again, and the scratch bits, including the top-of-document bit, can be searched with a mask to determine if all of the terms are present or not, as specified. In the case of complicated Boolean searches, it may be necessary to break down the search into parts, in which the result of each part is stored in a single scratch bit, and a final comparison is done on the scratch bits set by each of the several parts. The process may be longer but require the use of fewer scratch bits. Because any Boolean comparison can be expressed as the sum of simple Boolean products, the system can be generalized to any Boolean expression, however complex.

FIG. 19 illustrates a flowchart describing a sample program implementing a string search using the embodiment of the invention described in FIG. 17. A string search represents a database query in which the user wishes to locate a series of search terms in sequence. To accommodate a string search, it is useful to structure the memory so as to have each atom contain, besides the code representing the data word and the position indicator, a mark bit. Such a mark bit would be associated with each data word, therefore, not only with each row.

The program searches each atom, according to the methods and using the instructions described above, and sets the mark bit associated with each atom in which the data word matches the first search term. Next, the program searches for all instances in which a data word matches the second search term and in which the mark bit for the previous atom has been set. That search can be done with a single instruction, because of the device's ability to match any sequence of bits, without regard to whether the bits represent a data word or the associated data. The previous atom's mark bit is cleared, regardless of the outcome, but all instances in which the second search results in a match are marked by setting the mark bit for the atom in which the second search term has been found. Finally, the program repeats the process as described in the second search for the third and all remaining search terms, which results in mark bits being set only for the final data words of each instance in which the search string is located.

FIG. 20 illustrates a flowchart describing a sample program implementing a proximity search using the embodiment of the invention described in FIG. 17. In a proximity search, it is desired to query the database to locate all documents in which search terms are located within a specified distance from each other in the document.

For illustration, the scratch data fields of FIG. 17 are filled with numbers generated from the case in which the program in FIG. 20 operates on the data in FIG. 17 during an example proximity search, which seeks to identify all instances in which the search term "good" is located within two English words of the search term "song."

First, the program searches the rows of the memory for a match to the first search term, here "good," and places the positional indicator associated with a match in a scratch field, shown as the third column in the scratch data of FIG. 17. If no match is found, the first of a five-bit scratch field, shown in the fifth scratch column in FIG. 17, is set. The process is repeated for the second search term, here "song," and the result placed in another scratch field, shown as the fourth scratch column in FIG. 17. If no match is found, the second of the five scratch bits is set.

Next, a limit subprocedure is invoked, to do the mathematics of comparing the two addresses to the limit, which is in the example, two words. The two numbers are subtracted, the difference is compared to the limit, and the third of the five scratch bits is set if the difference is greater than the limit. Next the difference is compared to the negative of the limit, because the two terms can qualify for the search regardless of which one appears first in the document, and the fourth of the five scratch bits is set if the difference is less than the negative of the limit. Finally, if all four scratch bits are unset, a fifth bit is set indicating those rows in which the proximity search has been satisfied, rows two and five in FIG. 17.

It is desireable to check for cases in which the two terms are within the desired proximity across a row boundary, and the program in FIG. 20 accomplishes that function also. For all rows other than the top row of a document, which is indicated by a zero in the first scratch column in FIG. 17, the following operation is performed: The number of data words from the row above (col. 2) is added to the location of the first search term (col. 3), and the location of the second search term (col. 4) is shifted from the row above. For clarity, in FIG. 17, the results of that operation are shown in columns six and seven of data, although the program would likely reuse columns three and four. The limit test subroutine described above is then repeated, with the outcome shown in the five scratch bits shown in the last column of FIG. 17 (although the actual program would reuse column five). The search thus identifies the rows in which the terms are within the desired proximity but one of the terms is at or near the end of the previous row. In FIG. 17, an example is shown for row three, in which "song" at the end of row two is two words from the word "good" at the beginning of row three.

Finally, the flowchart of FIG. 20 includes a third routine in which the data are shifted up, to attempt to locate instances in which a document row contains the second search term within the desired proximity from the first search term in the previous row. A more complex program could shift the data more than one row in either direction, thus allowing proximity queries to use a larger separation distance. The program could use the knowledge of the number of atoms per line to determine the number of shifts needed in the worst case, and perform exactly that number of shifting operations.

The proximity search benefits from the layout rule specified above preventing the same data word from appearing twice on one row. That rule avoids any ambiguities and allows the program to calculate the distance between two words in a row with only one operation.

More complex proximity searches can contain a plurality of search terms, which would require the program to operate on each pair of terms separately. The complexity of a proximity search, therefore, increases as the combination of the number of terms.

The system of the invention, however, permits more efficient proximity searching by finding the search terms in data more efficiently and transferring the address to memory quickly, which can greatly reduce the search time, even if there were no improvement in the speed of the mathematics needed to calculate and examine the separation distances. Prior proximity searching systems spend most of the search time locating the search terms, rather than verifying that the located terms satisfy the proximity requirements. The ability of the invention to shift data matching a selectable criterion to a fixed non-data-filled memory location within the row allows uniform row-by-row calculation of desired results.

The system of the invention can handle combinations of proximity, string, and Boolean searches. For example, one may wish to look for all documents containing (a) "George Bush" and (b) "arms" within three words of "hostages" but (c) not dated after the year 1988 or before the year 1984.

The system illustrated in connection with FIG. 20 can be adjusted to perform an "inner product" search, in which a weighting factor is assigned to some defined characteristic of the data. For example, each atom may include a field containing a "weight code," designed to express the frequency or importance of the data word or some characteristic about it, such as its type (e.g., whether it is a verb, a noun, etc.). Then, any of the above-described searches is run, but a "hit" is weighted by some mathematical function of the weight codes of one or more search term. For example, locating word A near word B can result in three points each time, while locating word D at least once in the document results in two points. Then, a search might request retrieval of all documents that score more than a selected number of points (say, ten), or just a selected number of the highest-scoring, that is "most relevant," documents.

It is useful to store long associative memory words along a column of dynamic memory, which in a database application may constitute a grouping of similar data, rather than along a row of dynamic memory. Row-wise storage, although straight-forward, requires as many pins as there are bits in the associative memory word for the data (and possibly the mask) operand, whereas column-wise organization requires only eight pins for the operand. Much more importantly, the two storage systems differ in the manner in which the associative memory is "scanned." Only one data row at a time can be read into the refresh amplifiers in the row-wise organization, but each row that has to be searched must be read one after another. To avoid reading all rows requires a "page management" scheduler to read only rows that need to be searched.

Column-wise organization, on the other hand, permits associative memory word columns to be read or written and other associative memory word columns to be skipped over selectively, which allows the system to utilize the comparator logic more efficiently on the data. Each atom in the column is in the refresh amplifiers at the time the search term is put on the pins. If the search instruction does not need to reference the other columns, they can be skipped over and not be read into the refresh amplifiers. (Of course, they must be periodically refreshed.) The search instruction can be sped up, if each column is of the same width, by a factor of three.

The above word organization is particularly efficient in databases with common patterns of data. For example, in a telephone directory database, the first column may contain all last names, the second column, first names, the third column addresses, and the fourth column telephone numbers. The first word of associative memory, therefore, contains all last names, but each person remains in a single row of the memory. That sort of column-wise organization is more efficient because the memory can avoid searching columns that are not involved in the search term, in which there are only "don't care" matches. For example, searching a 100-row database for "Smith" requires operation only on one word, not all four columns, and not the 100 searches that would be required in a row-wise organization. The comparator hardware is used only to search data that must be searched and not wasted searching columns that have all "don't cares." The columns to be skipped can be directly determined by noting which instruction operand's columns have only "don't cares."

DAAM instructions usually scan columns of the associative memory, which are rows of the dynamic memory chip, sequentially (say from left to right), but start the scan at some fixed column number and continue the scan for a fixed number of columns. Some instructions scan in that manner and then jump to another collection of columns to scan them sequentially, and others scan in the reverse direction. It is possible to scan all columns, and it is necessary to do that periodically to refresh all of the memory. The typical instruction refreshes only part of the memory that is actually searched, output, or written.

The routines described above include certain arithmetic or Boolean logic operations, particularly within the associative memory word. For example, the proximity search described above in connection with FIGS. 17 and 20 requires subtraction to determine the distance between located search terms. It is advantageous to implement the following system of arithmetic operations, particularly in DAAMs that have been based on DRAMs.

To perform faster arithmetic operations, the preferred circuit can utilize the following instructions. First, the Compare ("C") instruction compares the data, d, with all words in the associative memory, in parallel, in a bitwise fashion. A value, m, represents a mask value for conditional comparing. For each bit that m is not set (not masked), the corresponding bit position of d is compared to the corresponding bit position of each associative memory word. A match flip-flop for each associate memory word is set if the compare was true, otherwise the match flip-flop is cleared. The data, d, and the mask, m, can be of any bit length up to the maximum word size but must be of equal length. Comparing starts from the left of the associative memory words and moves to the right until d (and m) are exhausted. An alternate form of this instruction (as will all instructions that have both data and mask) is to express only one opcode that is a combination of d and m. In this form, the opcode will show 'x' or '?' wherever the mask would be set (masked, and therefore, don't cares). For example, if d=10010110, and m=11000011, the combined opcode would be 10xxxx10.

Second, the Multiwrite ("MW") instruction writes the value of d into all associative memory words where the match flip-flop is set and then clears the match flip-flop.

Again, m is a mask value that allows conditional bit writing. (The terms d and m are as defined as in the Compare instruction. The d and m values can also be collapsed into a single opcode as defined above.)

Third, the Compare-Not-And ("CNA") instruction works as defined for the Compare instruction with the following difference: The match flip-flop is set only if (a) the compare was successful and (b) the value of the match flip-flop was zero prior to the execution of the CNA instruction. In logical terms, Match flip-flop=success of compare AND NOT old Match flip-flop (where NOT means inverse). Again, as with all instruction, the CNA is performed for each associative memory word, in parallel.

Fourth, the Compare-Or ("CO") instruction works as defined for the Compare instruction except that the match flip-flop is set if it was set previously or if the compare is successful. In other words, the match flip-flop is not cleared if the match fails, provided that the match flip-flop was set prior to the execution of the CO instruction. If the compare fails and the match flip-flop was not set, the match flip-flop remains cleared.

The device performs arithmetic operations, such as addition, comparison, and shifting for multiplication and division, on numbers obtained from a search such as a proximity query or inner product query, in a manner that is more efficient, but less conventional, than normal binary arithmetic. A typical DRAM has a "page mode" read operation that permits the system to read a whole row from the bit array storage (which is a column of associative memory in the embodiment discussed above) into the sense amplifiers. Using that function allows the arithmetic operations to be speeded up by about a factor of four by searching and rewriting data while the data are in the sense amplifiers, rather than outputting the same data from the bit array each memory read operation, searching or modifying them, and then rewriting them back into the bit array storage.

However, to efficiently search and modify the data in the sense amplifiers, an associative memory word must have all the bits that will be searched or modified simultaneously available in the sense amplifiers associated with that word. It is preferrable, therefore, to arrange the data so a byte-wide column of the associative memory word is in the eight sense amplifiers. Although eight amplifiers are used for exemplary purposes, it is possible to use any number of amplifiers in each row, as long as there are at least two.

Consider adding two numbers, identified here as two nine-bit numbers a8, a7, a6, a5, a4, a3, a2, a1, a0 and b8, b7, b6, b5, b4, b3, b2, b1, b0, where for instance a3 is the third least significant bit of the number a. In the rightmost byte of scratch memory, the data are arranged so as to have, in order, a carry bit (c), an unused bit, then a2, a1, a0 and then b2, b1, b0. In the second rightmost byte of scratch memory, the bits are another carry bit, an unused bit, then a5, a4, a3 and then b5, b4, b3. In the third rightmost byte of scratch memory, the bits are another carry bit, a carry used during the addition of bit a7 to b7, which is called "mid carry" and is used to indicate a two's complement number overflow, then a8, a7, a6 and then b8, b7, b6. The least significant bit a0 is added to b0, and the result is put into carry c and b0, according to the series of operations in the program described in FIG. 21, which illustrates the special treatment of the least significant bit and most significant bit. The significance of this organization of data is that four of the instructions shown sequentially above can be executed in the time it takes to execute one such instruction if data are read from a row of the bit array into the sense amplifier, operated on, and then written back into the row of the bit array.

Any operation that can be defined in terms of a truth-table can be implemented using operations C, CO, CNA, and MW; the rows of the truth table where the result (number b) or the state (carry c) change are coded into a pair of instructions, a C instruction is used to identify the input pattern, and the MW instruction is used to write the changed pattern. To improve the program's efficiency, if patterns require the same change, the two instructions C MW and C MW can be replaced by the instruction sequence C CO MW.

It is understood by those skilled in the art that numerous alternate forms and embodiments of the invention can be devised without departing from its spirit and scope.

I claim:

1. An information storage and searching apparatus comprising:
    (a) an information-storage device;
    (b) at least one electronic memory device, which device is integrated on a semiconductor chip, electronically coupled to the storage device, and having a plurality of multiple-bit word storage locations, wherein each word storage location consists of a plurality of uniform-length subunits; and
    (c) control circuitry structured (i) to control the couplings between the storage device and the memory device to transfer information stored in the storage device to the memory device, and (ii) to pass a comparand to the memory device;
    (d) said memory device having associated with each of the word storage locations: (i) a comparator circuit coupled to compare a portion of the comparand, which portion has length equal to one of the subunits, with information stored in a selected one of the subunits of the word, (ii) a refresh circuit structured to periodically refresh information in each word storage location, wherein the comparator circuit is electrically connected to the output of the refresh circuit, so that the comparator circuit can compare the portion of the comparand with the selected subunit while the refresh circuit refreshes the selected subunit, and (iii) a single-bit storage element coupled to the comparator circuit so as to indicate a mismatch between the comparand portion and information stored in the selected subunit.

2. The apparatus of claim 1 wherein the information-storage device includes at least one magnetic storage device.

3. The apparatus of claim 1 wherein the information-storage device includes at least one optical storage device.

4. The apparatus of claim 1 wherein the information-storage device includes at least one multiple-platter storage device.

5. The apparatus of claim 4 wherein the information-storage device includes at least one read head associated with each platter of the multiple-platter storage device.

6. The apparatus of claim 5 wherein said control circuitry comprises:
    (a) means for enabling the read heads of a plurality of the platters at the same time;
    (b) means for assembling the information read by the enabled read heads in a predetermined sequence; and
    (c) means for transferring the assembled information to predetermined locations in the memory device.

7. The apparatus of claim 1 wherein the information-storage device includes at least one solid state memory device.

8. The apparatus of claim 1 wherein the information-storage device includes at least one magnetic tape storage.

9. The apparatus of claim 1 wherein the information-storage device includes at least one flash memory device.

10. The apparatus of claim 1 wherein the control circuitry switches a switchable data bus.

11. The apparatus of claim 1 wherein the control circuitry includes at least an integrated processor circuit and a program store containing at least one sequence of instructions.

12. The apparatus of claim 1:
   (a) further comprising a plurality of said electronic memory devices arranged in a plurality of banks;
   (b) wherein the control circuitry switches a switchable bus capable of connecting the information-storage device to any selected one of the memory banks; and
   (c) wherein the control circuitry is coupled to control one of the memory banks while at least one other memory bank is coupled to the information-storage device.

13. The apparatus of claim 1 wherein each of said subunits comprises a byte.

14. The apparatus of claim 1:
   (a) wherein said control circuitry is structured to pass to the memory device a mask having length equal to the comparand;
   (b) wherein said comparator circuit associated with each of the word storage locations is further coupled to compare unmasked bits of the comparand portion with information stored in unmasked bits of the selected subunit; and
   (c) wherein the single-bit storage element is coupled to the comparison circuit so as to indicate a mismatch between the unmasked bits of the comparand portion and the unmasked information stored in the selected subunit.

15. The apparatus of claim 14 wherein said control circuitry is structured to pass to the comparator circuits of the memory device a sequence of portions of the comparand and portions of the mask, each portion having a length equal to one of the subunits, for comparison with a sequence of subunits of the words, and wherein the single-bit storage element for each word indicates, at any point in the sequence, a mismatch between any of the unmasked comparand portions to that point in the sequence and the information stored in the associated, unmasked subunit of the word.

16. The apparatus of claim 1 wherein said control circuitry is structured to pass to the comparator circuits of the memory device a sequence of portions of the comparand, each portion having a length equal to one of the subunits, for comparison with a sequence of subunits of the words, and wherein the single-bit storage element for each word indicates, at any point in the sequence, a mismatch between any of the comparand portions to that point in the sequence and the information stored in the associated subunit of the word.

17. The apparatus of claim 16 wherein said control circuitry is structured to cause the memory device to output in sequence information stored in any selected group of at least one subunit, from each word storage location that has a storage element that does not indicate a mismatch when the sequence is completed.

18. The apparatus of claim 16 wherein said control circuitry is structured to cause the memory device to transfer the information stored in any selected group of at least one subunit, in each word storage location that has a storage element that does not indicate a mismatch when the sequence is completed, to another group of at least one subunit located at a predeterminated relative position.

19. The apparatus of claim 16 wherein said control circuitry is structured to cause the memory device to alter in a predetermined fashion the information stored in any selected group of at least one subunit, in each word storage location that has a storage element that does not indicate a mismatch when the sequence is completed.

20. An information storage and searching apparatus comprising:
   (a) an information-storage device;
   (b) at least one electronic memory device integrated on a semiconductor chip, electronically coupled to the information-storage device, and comprising:
      (i) a multitude of single-bit storage cells distributed among a plurality of multiple-bit word cells;
      (ii) wherein the bit cells of each word cell are arranged in at least one column comprised of a plurality of bit cells;
      (iii) a plurality of amplifiers on the chip, each column associated with one of said amplifiers;
      (iv) wherein each of the amplifiers may be electrically coupled to any bit cell in any column with which that amplifier is associated;
      (v) an addressing circuit coupled to each of the amplifiers associated with columns of at least one word cell;
      (vi) wherein the addressing circuit controls the coupling of the amplifiers to the bit cells of any row of the associated columns, the bits of each row together comprising a uniform-length subunit of the word cell; and
      (vii) a comparison circuit on the chip, coupled to the amplifiers in at least one word cell and having an output line coupled to the single-bit storage cells, which comparison circuit is structured to compare a selected portion of a comparand which portion has length equal to one of the subunits, with a group of bits amplified by said amplifiers and to generate an electrical signal on said output line when the portion of the comparand does not match the group of bits amplified from the bit cells in one row of the columns; and
   (c) control circuitry structured (i) to control the couplings between the storage device and the memory device to transfer information stored in the storage device to the memory device, and (ii) to pass the comparand to the memory device;
   (d) said memory device having associated with each of the word cells a single-bit storage element coupled to the comparison circuit so as to indicate a mismatch between the comparand portion and the amplified bits of the subunit.

21. The apparatus of claim 20 wherein the memory device comprises at least one associative memory on an integrated circuit, wherein each of a plurality of word cells has a comparison circuit and an associated output line, and wherein the comparison circuits as a whole is structured to permit simultaneous comparisons between the comparand and bits from each of the plurality of word cells.

22. The apparatus of claim 20 wherein the comparison circuit is electrically connected to the output of a refresh circuit structured to periodically refresh information in each word cell, so that the comparison circuit can compare the portion of the comparand with the amplified bits of the subunit while the refresh circuit refreshes the subunit.

23. The apparatus of claim 20 wherein the control circuitry switches a switchable data bus.

24. The apparatus of claim 20 wherein the control circuitry includes at least an integrated processor circuit and a program store containing at least one sequence of instructions.

25. The apparatus of claim 20 wherein the information-storage device includes at least one magnetic storage device.

26. The apparatus of claim 20 wherein the information-storage device includes at least one optical storage device.

27. The apparatus of claim 20 wherein the information-storage device includes at least one multiple-platter storage device and at least one read head associated with each platter of the multiple-platter storage device.

28. The apparatus of claim 27 wherein said control circuitry comprises:
   (a) means for enabling the read heads of a plurality of the platters at the same time;
   (b) means for assembling the information read by the enabled read heads in a predetermined sequence; and
   (c) means for transferring the assembled information to predetermined locations in the memory device.

29. The apparatus of claim 20 wherein the information-storage device includes at least one solid state memory device.

30. The apparatus of claim 20 wherein the information-storage device includes at least one magnetic tape storage.

31. The apparatus of claim 20 wherein the information-storage device includes at least one flash memory device.

32. The apparatus of claim 20:
   (a) further comprising a plurality of said memory devices arranged in a plurality of banks;
   (b) wherein the control circuitry switches a switchable bus capable of connecting the information-storage device to any selected one of the memory banks; and
   (c) wherein the control circuitry is coupled to control one of the memory banks while at least one other memory bank is coupled to the information-storage device.

33. The apparatus of claim 20 wherein the bits of each word cell are arranged in eight columns, so that each of said subunits comprises a byte.

34. The apparatus of claim 20 wherein said control circuitry is structured to pass to the comparator circuit of the memory device a sequence of portions of the comparand, each portion having a length equal to one of the subunits, for comparison with a sequence of subunits of the words, and wherein the single-bit storage element for each word indicates, at any point in the sequence, a mismatch between any of the comparand portions to that point in the sequence and the information stored in the associated subunit of the word.

35. The apparatus of claim 34 wherein said control circuitry is structured to cause the memory device to output in sequence information stored in any selected group of at least one subunit, from each word cell that has a storage element that does not indicate a mismatch when the sequence is completed.

36. The apparatus of claim 34 wherein said control circuitry is structured to cause the memory device to transfer the information stored in any selected group of at least one subunit, in each word cell that has a storage element that does not indicate a mismatch when the sequence is completed, to another group of at least one subunit located at a predeterminated relative position.

37. The apparatus of claim 34 wherein said control circuitry is structured to cause the memory device to alter in a predetermined fashion the information stored in any selected group of at least one subunit, in each word cell that has a storage element that does not indicate a mismatch when the sequence is completed.

38. A data storage system comprising:
   (a) memory means for storing a plurality of multiple-bit words in predetermined multiple-bit word storage locations; and
   (b) means for searching the multiple-bit words stored in said storage locations for a selected pattern of bits of data, said pattern containing fewer bits than each of the words, and for transferring any selected portion of the data of each of the words containing the matching bit pattern to a predetermined location in the memory means relative to the original location of the selected portion.

39. A data storage device comprising:
   (a) dynamic data storage means, integrated on a single semiconductor chip, for storing a plurality of multiple-bit data words in a plurality of addressable predetermined multiple-bit word storage locations, said locations requiring refreshing to retain data, wherein bits of the words form an array;
   (b) addressing circuit means integrated on the chip for periodically addressing every bit location of the array;
   (c) refresh circuit means, integrated on the chip and randomly connectable by said addressing circuit means to each of said bit locations, for periodically refreshing the data stored in each of said bit locations by simultaneously reading a plurality of bits stored in a word location that is connected by the addressing circuit means into a plurality of associated sense amplifiers and re-writing the contents of said sense amplifiers to the connected word location; and
   (d) logic means, integrated on the chip and electrically coupled to the sense amplifiers, for comparing, for each data word, a first subset of bits in the sense amplifiers to at least one predetermined value, and for setting a second subset of bits in the sense amplifiers to a predetermined value.

40. The apparatus of claim 39 wherein the storage means comprises means for storing a plurality of multiple-bit words, each in a row of a bit array, and wherein the refresh circuit means comprises means for refreshing a plurality of columns of the bit array.

41. The apparatus of claim 39 wherein the refresh circuit means reads and writes data stored in each of said connected word locations one byte at a time.

42. A method of storing and content-searching on data comprising:
   (a) storing electronic data in a data storage device;
   (b) transferring the data from the data storage device to a plurality of multiple-bit word storage locations of a memory circuit, wherein each word storage location consists of a plurality of uniform-length subunits;
   (c) periodically refreshing data stored at each bit location of the memory circuit; and
   (d) searching for a selected data pattern of any desired length, by examining data stored in the memory circuit beginning at each subunit boundary of each of the plurality of word storage locations and comparing the stored data with the selected data pattern concurrent with refreshing, and wherein searching proceeds simultaneously with respect to all of the plurality of word storage locations.

43. The method of claim 42 further comprising repeating (b), (c) and (d) a plurality of times.

44. The method of claim 43:
   (a) wherein transferring includes selecting a first of a plurality of content-searchable memory banks as a target for the transferred data;
   (b) wherein searching includes searching a second of the memory banks while transferring; and (c) further comprising, after transferring and searching are completed, switching the first and second memory banks, so that the next transfer uses the second bank as a target, and the next search operates on data in the first bank.

45. The method of claim 42 further comprising generating a mismatch signal associated with each word for which the data pattern was not found within the word.

46. The method of claim 45 further comprising outputting in sequence data stored in any selected group of at least one subunit of each word storage location for which said mismatch signal is not generated.

47. The method of claim 45 further comprising storing the mismatch signal in a plurality of bit locations in the memory circuit, one bit location associated with each word.

48. The method of claim 45 further comprising outputting the mismatch signal from the memory circuit.

49. The method of claim 42 wherein the uniform-length subunits consist of single bits.

50. The method of claim 42 wherein the uniform-length subunits consist of multiple-bit subunits.

51. The method of claim 50 wherein the uniform-length subunits consist of bytes.

52. The method of claim 50 wherein searching further comprises applying a mask to the data and searching for the selected data pattern by examining only unmasked data in the memory circuit.

53. The method of claim 52 wherein searching comprises:
  (a) clearing a plurality of single-bit storage locations, each one of which is associated with one of the plurality of words;
  (b) in each of the plurality of words, searching for a first portion of the selected data pattern, which portion has length equal to one of the subunits, by examining unmasked data in the memory circuit beginning at each subunit boundary;
  (c) for each word in which the portion of the data pattern is not found, generating a mismatch signal and storing the mismatch signal in a single-bit storage location associated with the word;
  (d) for each word in which the portion of the data pattern is found, marking each subunit matching the portion of the data pattern; (e) for each word in which the previous portion of the data pattern was found, searching for a next portion of the data pattern, which portion has length equal to one of the subunits, by examining unmasked data in the memory circuit beginning at the subunit boundary adjacent to each marked subunit, and repeating (c) and (d) with respect to said next portion of the data pattern; and
  (f) repeating (e) for each subunit-length portion of the selected data pattern.

54. A method of storing and manipulating data comprising:
  (a) storing a plurality of multiple-bit data words in a plurality of predetermined multiple-bit word storage locations;
  (b) periodically accessing each of said locations to refresh the data stored therein by, for each of said locations, reading a plurality of bits from the associated data word simultaneously into a set of associated sense amplifiers and writing bits in the sense amplifiers simultaneously back into the original locations of the plurality of bits; and
  (c) simultaneously for each data word, after the bits are read into the sense amplifiers, comparing a first subset of bits in the sense amplifiers to a predetermined value and setting a second subset of bits in the sense amplifiers to values determined by the results of the comparison.

55. The method of claim 54 wherein the act of part (c) is performed a plurality of times, each time with another predetermined value, while the bits remain in the sense amplifiers.

56. A method of storing and content-searching on data comprising:
  (a) storing electronic data in a data storage device;
  (b) transferring the data from the data storage device to a plurality of multiple-bit word storage locations of a memory circuit, wherein each word storage location consists of a plurality of uniform-length subunits; and
  (c) searching for a selected data pattern of any desired length wherein searching proceeds simultaneously with respect to all of the plurality of word storage locations, and wherein searching comprises:
    (i) clearing a plurality of single-bit storage locations, each one of which is associated with one of the plurality of words;
    (ii) in each of the plurality of words, searching for a first portion of the selected data pattern, which portion has length equal to one of the subunits, by examining data in the memory circuit beginning at each subunit boundary;
    (iii) for each word in which the portion of the data pattern is not found, generating a mismatch signal and storing the mismatch signal in a single-bit storage location associated with the word;
    (iv) for each word in which the portion of the data pattern is found, masking each subunit matching the portion of the data pattern;
    (v) for each word in which the previous portion of the data pattern was found, searching for a next portion of the data pattern, which portion has length equal to one of the subunits, by examining data in the memory circuit beginning at the subunit boundary adjacent to each masked subunit, and repeating (iii) and (iv) with respect to said next portion of the data pattern; and
    (vi) repeating (v) for each subunit-length portion of the selected data pattern.

57. The method of claim 56 further comprising periodically refreshing data stored at each bit location of the memory circuit, and wherein searching includes comparing the refreshed data and the selected data pattern concurrent with refreshing.

58. The method of claim 56 further comprising repeating (b) and (c) a plurality of times; wherein transferring includes selecting a first of a plurality of content-searchable memory banks as a target for the transferred data; wherein searching includes searching a second of the memory banks while transferring; and further comprising, after transferring and searching are completed, switching the first and second memory banks, so that the next transfer uses the second bank as a target, and the next search operates on data in the first bank.

59. The method of claim 56 further comprising outputting in sequence data stored in any selected group of at least one subunit of each word storage location for which said mismatch signal is not generated.

60. The method of claim 56 further comprising outputting the mismatch signal from the memory circuit.

61. The method of claim 56 wherein the uniform-length subunits consist of single bits.

62. The method of claim 56 wherein the uniform-length subunits consist of multiple-bit subunits.

63. The method of claim 62 wherein the uniform-length subunits consist of bytes.

64. An information storage and searching apparatus comprising:

an information-storage device;

at least one electronic memory device, which device is integrated on a semiconductor chip, electronically coupled to the storage device, and having a plurality of multiple-bit word storage locations, wherein each word storage location consists of a plurality of uniform-length subunits; and (c) control circuitry structured (i) to control the couplings between the storage device and the memory device to transfer information stored in the storage device to the memory device, and (ii) to pass to the memory device a sequence of portions of a comparand, each portion having a length equal to one of the subunits, for comparison with a sequence of subunits of the words;

(d) said memory device having associated with each of the word storage locations: (i) a comparator circuit coupled to compare each of said portions of the comparand with said sequence of subunits, and (ii) a single-bit storage element for each word coupled to the comparator circuit so as to indicate, at any point in the sequence, a mismatch between any of the comparand portions to that point in the sequence and the information stored in the associated subunit of the word.

65. The apparatus of claim 64 wherein said control circuitry is structured to cause the memory device to output in sequence information stored in any selected group of at least one subunit, from each word storage location that has a storage element that does not indicate a mismatch when the sequence is completed.

66. The apparatus of claim 64 wherein said control circuitry is structured to cause the memory device to transfer the information stored in any selected group of at least one subunit, in each word storage location that has a storage element that does not indicate a mismatch when the sequence is completed, to another group of at least one subunit located at a predeterminated relative position.

67. The apparatus of claim 64 wherein said control circuitry is structured to cause the memory device to alter in a predetermined fashion the information stored in any selected group of at least one subunit, in each word storage location that has a storage element that does not indicate a mismatch when the sequence is completed.

68. A method of automatically manipulating data in storage comprising:

(a) storing a plurality of multiple-bit words in predetermined multiple-bit word storage locations of a memory;

(b) searching the multiple-bit words stored in said storage locations for a selected pattern of bits of data, said pattern containing fewer bits than each of the words; and (c) transferring any selected portion of the data of each of the words containing the matching bit pattern to a predetermined location in the memory relative to the original location of the selected portion.

\* \* \* \* \*